United States Patent
Yokono

(10) Patent No.: US 12,250,851 B2
(45) Date of Patent: Mar. 11, 2025

(54) DRIVE CIRCUIT ARRAY SUBSTRATE INCLUDING WELL TAPS PROVIDED IN SUBSET THEREOF, DISPLAY DEVICE, AND ELECTRONIC APPARATUS

(71) Applicant: Sony Group Corporation, Tokyo (JP)

(72) Inventor: Tokihiro Yokono, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 18/651,194

(22) Filed: Apr. 30, 2024

(65) Prior Publication Data

US 2024/0357863 A1 Oct. 24, 2024

Related U.S. Application Data

(63) Continuation of application No. 17/607,602, filed as application No. PCT/JP2021/024514 on Jun. 29, 2021, now Pat. No. 11,997,882.

(30) Foreign Application Priority Data

Jul. 10, 2020 (JP) .................. 2020-119196

(51) Int. Cl.
*H10K 59/121* (2023.01)
(52) U.S. Cl.
CPC ............... *H10K 59/1213* (2023.02)
(58) Field of Classification Search
CPC ...... H10K 19/20; H10K 19/202; H10K 19/80; H10K 39/501; H10K 59/1213; H10K 59/771
USPC .......................................................... 257/40
See application file for complete search history.

(56) References Cited

U.S. PATENT DOCUMENTS

| | | | | |
|---|---|---|---|---|
| 2011/0169813 | A1* | 7/2011 | Jin | G09G 3/20 345/212 |
| 2019/0385522 | A1* | 12/2019 | Song | G09G 3/3233 |

FOREIGN PATENT DOCUMENTS

| | | |
|---|---|---|
| JP | 2002-221917 A | 8/2002 |
| JP | 2003-317961 A | 11/2003 |
| JP | 2008-039876 A | 2/2008 |
| JP | 2013105086 A | 5/2013 |
| JP | 2020071323 A | 5/2020 |
| KR | 20110081442 A | 7/2011 |
| WO | 2018047504 A1 | 3/2018 |

OTHER PUBLICATIONS

International Search Report (PCT/ISA/210), International Application No. PCT/JP2021/024514, dated Jul. 20, 2021.

(Continued)

*Primary Examiner* — Matthew E. Gordon
(74) *Attorney, Agent, or Firm* — Michael Best & Friedrich LLP

(57) ABSTRACT

A display device according to the present disclosure includes: a drive circuit array substrate including drive circuits arranged in an array pattern on a semiconductor substrate; and light emitting elements arranged in an array pattern over the drive circuits and driven by the drive circuits, in which in a drive circuit group including a plurality of the drive circuits that are adjacent to each other, a well tap is provided in a part of the drive circuits of the plurality of the drive circuits included in the drive circuit group.

20 Claims, 37 Drawing Sheets

(56) References Cited

OTHER PUBLICATIONS

Notification of Transmittal of the International Search Report and the Written Opinion of the International Searching Authority, or the Declaration (PCT/ISA/220), International Application No. PCT/JP2021/024514, dated Aug. 3, 2021.
Written Opinion of the International Search Authority (PCT/ISA/237), International Application No. PCT/JP2021/024514, dated Aug. 3, 2021.
Jun Jae Hun et al: "Near threshold voltage digital PLL using low voltage optimised blocks for AR display system," IET Circuits Devices and Systems. The Institution of Engineering and Technology. Mar. 1, 2020 (Mar. 1, 2020). vol. 14, No. 2, pp. 155-158, XP006089115, ISSN: 1751-858X, DOI :10.1049/IET-CDS.2018.5468.

\* cited by examiner

DRIVE CIRCUIT ARRAY SUBSTRATE INCLUDING WELL TAPS PROVIDED IN SUBSET THEREOF, DISPLAY DEVICE, AND ELECTRONIC APPARATUS

CROSS REFERENCE TO RELATED APPLICATIONS

This application is a Continuation of application Ser. No. 17/607,602, filed Oct. 29, 2021, which is a National Stage Application of PCT/JP2021/024514, filed Jun. 29, 2021, and claims the benefit of Japanese Priority Patent Application JP 2020-119196 filed Jul. 10, 2020, the entire contents of which are incorporated herein by reference.

FIELD

The present disclosure relates to a drive circuit array substrate, a display device, and an electronic apparatus.

BACKGROUND

A display device, including a drive circuit array substrate in which drive circuits including transistors are arranged in a matrix pattern and light emitting elements arranged in an array pattern over the drive circuit array substrate, is known. For example, a compact, high-definition self-luminous display, in which drive circuits are formed on a silicon substrate and light emitting elements each including an organic light emitting layer are arranged over the drive circuits, is called a micro organic light emitting diode (M-OLED) display.

The M-OLED display has features such as high brightness, high definition, and small volume. Therefore, applications to electronic viewfinders for digital cameras, optical engines for head mounted displays, and the like are progressing. As a circuit for driving a light emitting element, a drive circuit including transistors and capacitors is well known (see, e.g., Patent Literature 1).

CITATION LIST

Patent Literature

Patent Literature 1: JP 2015-187672 A

SUMMARY

Technical Problem

As the definition of a display device becomes higher, it is necessary to reduce the size of a transistor to be used in a drive circuit for driving a light emitting element. However, as the size of the transistor becomes smaller, the threshold of the transistor also varies. Therefore, as the definition of the display device becomes higher, degree of unevenness in brightness deteriorates qualitatively.

Therefore, an object of the present disclosure is to provide a display device capable of reducing unevenness in brightness while achieving high definition, an electronic apparatus including the display device, and a drive circuit array substrate to be used in the display device and the like.

Solution to Problem

A drive circuit array substrate according to the present disclosure to reach the object described above includes drive circuits arranged in an array pattern on a semiconductor substrate, wherein in a drive circuit group including a plurality of the drive circuits that are adjacent to each other, a well tap is provided in a part of the drive circuits of the plurality of the drive circuits included in the drive circuit group.

A display device according to the present disclosure to reach the object described above includes: a drive circuit array substrate including drive circuits arranged in an array pattern on a semiconductor substrate; and light emitting elements arranged in an array pattern over the drive circuits and driven by the drive circuits, wherein in a drive circuit group including a plurality of the drive circuits that are adjacent to each other, a well tap is provided in a part of the drive circuits of the plurality of the drive circuits included in the drive circuit group.

An electronic apparatus according to the present disclosure to reach the object described above includes a display device that includes: a drive circuit array substrate including drive circuits arranged in an array pattern on a semiconductor substrate; and light emitting elements arranged in an array pattern over the drive circuits and driven by the drive circuits, wherein in a drive circuit group including a plurality of the drive circuits that are adjacent to each other, a well tap is provided in a part of the drive circuits of the plurality of the drive circuits included in the drive circuit group.

DESCRIPTION OF EMBODIMENTS

Figure 1:
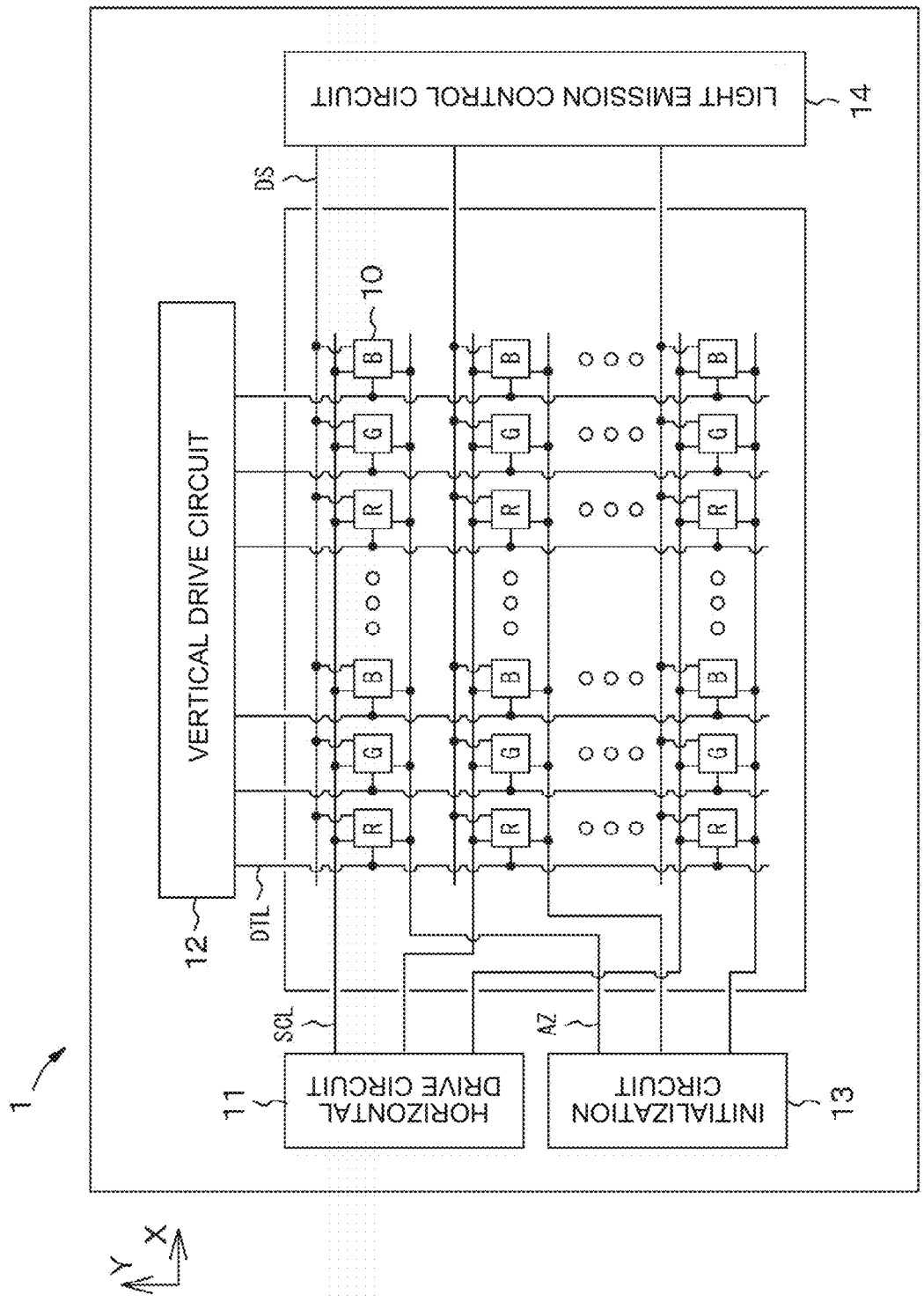
FIG. 1 is a conceptual view of a display device according to a first embodiment.

Hereinafter, the present disclosure will be described based on embodiments with reference to the drawings. The present disclosure is not limited to the embodiments, and various numerical values and materials in the embodiments are examples. In the following description, the same reference signs will be used for the same elements or elements having the same functions, and redundant description will be omitted. Note that the description will be given in the following order.

1. General description of drive circuit array substrate, display device, and electronic apparatus according to the present disclosure
2. First embodiment
3. First modification
4. Second modification
5. Description of electronic apparatus
6. Others General Description of Drive Circuit Array Substrate, Display Device, and Electronic Apparatus According to the Present Disclosure In the following description, a drive circuit array substrate according to the present disclosure, the drive circuit array substrate to be used in a display device according to the present disclosure, and the drive circuit array substrate to be used in the display device included in an electronic apparatus according to the present disclosure, may be simply referred to as a [drive circuit array substrate of the present disclosure]. In addition, a display device according to the present disclosure and the display device to be used in an electronic apparatus according to the present disclosure may be simply referred to as a [display device of the present disclosure].

As described above, the drive circuit array substrate of the present disclosure includes drive circuits arranged in an array pattern on a semiconductor substrate, in which
in a drive circuit group including a plurality of the drive circuits that are adjacent to each other, a well tap is provided in a part of the drive circuits of the plurality of the drive circuits included in the drive circuit group.

In a configuration in which a well tap is provided in a part of the drive circuits included in the drive circuit group, a ratio of a region occupied by the well tap can be made smaller than a configuration in which a well tap is provided in every drive circuit. Therefore, regions where transistors and the like are to be arranged can be expanded by that amount.

In the drive circuit array substrate of the present disclosure, a transistor constituting a predetermined drive circuit, in the plurality of the drive circuits included in the drive circuit group, can be configured to have a larger size than transistors of the other drive circuits. In this case, a transistor for supplying a current, of the transistors constituting the predetermined drive circuit, can be configured to have a larger size.

In the drive circuit array substrate of the present disclosure including the above-described various preferred configurations, a well tap is configured to be provided in a predetermined drive circuit in a plurality of drive circuits included in a drive circuit group.

In the drive circuit array substrate of the present disclosure including the above-described various preferred configurations, the drive circuit group includes a first drive circuit, a second drive circuit, and a third drive circuit,
the second drive circuit is arranged to be sandwiched by the first drive circuit and the third drive circuit,
the well tap is provided in the second drive circuit, and
a transistor constituting the second drive circuit can be configured to have a larger size than transistors of the first drive circuit and the third drive circuit.

In this case, the third drive circuit, in the drive circuit group, can be configured to have a circuit arrangement in which the first drive circuit is vertically and horizontally inverted.

Alternatively, in this case, a configuration can be adopted in which a pair of the drive circuit groups, adjacent to each other and side by side in a longitudinal direction of the drive circuit, are arranged to form a repeating unit. The first drive circuit and the third drive circuit belonging to one drive circuit group of the pair of the drive circuit groups can be configured to have circuit arrangements in which the first drive circuit and the third drive circuit belonging to the other drive circuit group are vertically inverted, respectively. In addition, the second drive circuit belonging to one drive circuit group of the pair of the drive circuit groups can be configured to have a circuit arrangement in which the second drive circuit belonging to the other drive circuit group is horizontally inverted, or a circuit arrangement in which the second drive circuit belonging to the other drive circuit group is vertically and horizontally inverted.

Alternatively, in this case, the drive circuit group can be configured to further include a fourth drive circuit.

In the drive circuit array substrate of the present disclosure including the above-described various preferred configurations, array of the respective drive circuits is not particularly limited, and may be arranged in, for example, a stripe array, a mosaic array, or a delta array. From the viewpoint of facilitating a circuit forming process and the like, it is preferable that the respective drive circuits are arranged in a stripe array.

As described above, the display device of the present disclosure includes:

a drive circuit array substrate including drive circuits arranged in an array pattern on a semiconductor substrate; and
light emitting elements arranged in an array pattern over the drive circuits and driven by the drive circuits, in which in a drive circuit group including a plurality of the drive circuits that are adjacent to each other, a well tap is provided in a part of the drive circuits of the plurality of the drive circuits included in the drive circuit group.

The display device of the present disclosure can be configured such that:

the drive circuit group includes a first drive circuit, a second drive circuit, and a third drive circuit;
the second drive circuit is arranged to be sandwiched by the first drive circuit and the third drive circuit;
the well tap is provided in the second drive circuit;
the transistor constituting the second drive circuit is configured to have a larger size than the transistors of the first drive circuit and the third drive circuit;
the first drive circuit and the third drive circuit are connected to a light emitting element corresponding to a red pixel and a light emitting element corresponding to a blue pixel, respectively; and
the second drive circuit is connected to a light emitting element corresponding to a green pixel.

When a transistor for supplying a current, of the transistors constituting the second drive circuit, is configured to have a larger size, a variation in the threshold of the transistor for applying a current to a light emitting element corresponding to a green pixel is reduced. Since green has a high luminosity factor, unevenness in brightness can be more effectively reduced.

In the display device of the present disclosure including the above-described preferred configuration, the drive circuit group can be configured to further include a fourth drive circuit connected to a light emitting element corresponding to a white pixel.

In the display device of the present disclosure including the above-described various preferred configurations, the respective light emitting elements can be configured to be arranged in a stripe array, a mosaic array, a square array, or a delta array.

In the display device of the present disclosure including the above-described various preferred configurations, for example, a current-driven light emitting element, in which luminous brightness changes in accordance with the value of a current flowing, can be used. Examples of the current-driven light emitting element include an organic electroluminescence element, an LED element, and a semiconductor laser element. These elements can be formed using well-known materials and methods. In particular, it is preferable from the viewpoint of forming a flat display device that the light emitting element includes an organic electroluminescence element.

An organic electroluminescence element is formed by disposing an organic layer formed by laminating a plurality of material layers between an anode electrode and a cathode electrode. The organic layer emits light when a voltage is applied between the anode electrode and the cathode electrode. The organic layer can be configured to have a structure in which for example, a hole injection layer, a hole transport layer, an organic light emitting layer, an electron transport layer, and an electron injection layer are laminated in this order from the anode electrode side. A hole transport material, an electron transport material, and an organic light emitting material constituting the organic layer are not particularly limited, and well-known materials can be used.

The organic electroluminescence element can be configured to be formed to emit, for example, white light. This configuration has an advantage that the organic layer can be formed as a common layer. The organic layer that emits white light may be configured to have a so-called tandem structure in which a plurality of organic light emitting layers are connected via charge generation layers or intermediate electrodes. A light emitting element that emits white light can be formed by, for example, laminating organic light emitting layers that emit red light, green light, and blue light, or laminating organic light emitting layers that emit yellow light and blue light. In the case of performing color display, a color filter in accordance with the color to be displayed may be appropriately arranged corresponding to each light emitting element. The color filter can be formed using, for example, a resin material containing a pigment or a dye.

Alternatively, the organic electroluminescence element may be configured to be formed to emit any one of red light, green light, and blue light. Although this configuration complicates the process of forming the organic layer, this configuration has an advantage of being excellent in luminous efficiency. Note that, also in this case, a color filter in accordance with the color to be displayed may be arranged in order to improve color purity or the like.

The display device may be configured to display a monochrome image or a color image. As the values of the pixels of the display device, some image resolutions such as (3840, 2160) and (7680, 4320) in addition to U-XGA (1600, 1200), HD-TV (1920, 1080), and Q-XGA (2048, 1536) can be mentioned as examples, but they are not limited to these values.

The electronic apparatus of the present disclosure can be configured to include the display device of the present disclosure including the above-described various preferred configurations. Examples of the electronic apparatus include direct view type and projection type display devices and various electronic apparatuses including an image display function.

Hereinafter, the drive circuit array substrate of the present disclosure, the display device of the present disclosure, and the electronic apparatus of the present disclosure may be simply referred to as [the present disclosure].

As the semiconductor substrate to be used in the present disclosure, a semiconductor substrate including, for example, silicon, and a substrate in which a semiconductor material layer such as a silicon single crystal layer is formed on a substrate such as quartz can be used.

A conductivity type of the transistor to be used in the drive circuit is not particularly limited. For example, a configuration including a p-channel transistor or a configuration including an n-channel transistor may be adopted. A configuration may be adopted in which, for example, a well region is provided in a silicon single crystal layer and a transistor is formed in the well region.

Materials constituting various wirings and electrodes to be used in the present disclosure are not particularly limited as long as they do not interfere with the implementation of the present disclosure. Metal materials such as copper (Cu), aluminum (Al), aluminum alloys such as AlCu and AlSi, tungsten (W), and a tungsten alloy such as tungsten silicide (WSi) can be used.

Materials constituting insulating layers, insulating films, and the like to be used in the present disclosure are not particularly limited as long as they do not interfere with the implementation of the present disclosure. For example, inorganic insulating materials such as silicon oxide ($SiO_x$), silicon nitride ($SiN_x$), or silicon oxynitride ($SiO_xN_y$), and organic insulating materials such as a polyimide-based resin, an acrylic-based resin, or a novolac-based resin, can be used.

In addition to the wirings and the electrodes, film forming methods of the insulating layers, the insulating films, and the like are not particularly limited, and they can be formed by using well-known film forming methods as long as they do not interfere with the implementation of the present disclosure. The same applies to patterning methods thereof.

Various conditions in the present description are satisfied not only when they are strictly satisfied but also when they are substantially satisfied. The presence of various variations caused by design or manufacturing is allowed. In addition, the drawings used in the following description are schematic, and do not indicate actual dimensions or ratios thereof.

First Embodiment

A first embodiment relates to a drive circuit array substrate, a display device, and an electronic apparatus according to the present disclosure.

FIG. 1 is a conceptual view of the display device according to the first embodiment.

The display device according to the first embodiment is an active matrix display device. A display device 1 includes pixels 10 arranged in a matrix pattern and various circuits such as a horizontal drive circuit 11, a vertical drive circuit 12, an initialization circuit 13, and a light emission control circuit 14 that are for controlling the pixels 10. A reference sign SCL denotes a scanning line for scanning the pixel 10, and a reference sign DTL denotes a signal line for supplying various voltages to the pixel 10. In addition, a reference sign DS denotes a control line for controlling light emission/non-light emission of the pixel 10, and a reference sign AZ denotes a control line for initializing the pixel 10.

In a state of being connected to the scanning lines SCL, the data lines DTL, the control lines AZ, and the control lines DS, a total of M×N pixels 10, for example, are arranged in a matrix pattern having M pixels in a row direction (X direction in the view) and N pixels in a column direction (Y direction in the view). The pixels 10 arranged in a two-dimensional pattern constitute a display region for displaying an image.

The number of each of the scanning lines SCL, the control lines AZ, and the control lines DS is M. The pixels 10 in an m-th row (where m=1, 2 . . . , M) are connected to an m-th scanning line $SCL_m$, an m-th control line $AZ_m$, and an m-th control line $DS_m$, and constitute one pixel row. In addition, the number of the data lines DTL is N. The pixels 10 in an n-th column (where n=1, 2 . . . , N) are connected to an n-th data line $DTL_n$. Note that, although not illustrated in FIG. 1, the display device 1 includes a common feed line and the like commonly connected to every pixel 10.

The pixels 10, the horizontal drive circuit 11, the vertical drive circuit 12, the initialization circuit 13, and the light emission control circuit 14 are integrally formed on a substrate. That is, the display device 1 is a driver circuit integrated display device.

A digital signal representing a gradation in accordance with an image to be displayed is supplied to the vertical drive circuit 12 from, for example, a non-illustrated device. The vertical drive circuit 12 generates an analog signal in accordance with a gradation value and supplies the analog signal to the data line DTL as a video signal. The analog signal generated is a signal whose maximum value is substantially equal to a power supply voltage supplied to the vertical drive circuit 12 and whose amplitude is about several volts.

The initialization circuit 13 supplies a control signal to the control line AZ. A potential of the light emitting element included in the pixel 10 is initialized by this control signal. The horizontal drive circuit 11 supplies a scanning signal to the scanning line SCL. The pixels 10 are line-sequentially scanned, for example, row by row by this scanning signal. The analog signal from the data line DTL is written in the scanned pixels 10.

The light emission control circuit 14 supplies a control signal to the control line DS. Light emission/non-light emission of the pixel is controlled by this control signal.

The display device 1 is a light emitting device capable of color display. In FIG. 1, the light emitting elements corresponding to red display, green display, and blue display are denoted by reference signs R, G, and B, respectively. The same applies to FIG. 15B and the like described later. A group of three pixels 10 arranged side by side in the row direction constitute one color pixel. Therefore, when N'=N/3, a total of N'×M color pixels are arrayed in the display region having N' color pixels in the row direction and M color pixels in the column direction.

As described above, the pixels 10 are line-sequentially scanned row by row by the scanning signal of the horizontal drive circuit 11. The pixel 10 located in the m-th row and the n-th column is hereinafter referred to as an (n, m)-th pixel 10.

In the display device 1, N pixels 10 arrayed in the m-th row are simultaneously driven. In other words, in the N pixels 10 disposed along the row direction, the light emission/non-light emission timing is controlled in a unit of a row that they belong to. When a display frame rate of the display device 1 is expressed as FR (times/second), a scanning period per row (so-called horizontal scanning period) when the display device 1 is line-sequentially scanned row by row is less than (1/FR)×(1/M) seconds.

The outline of the display device 1 has been described above. Next, a basic configuration of the pixel 10 will be described.

Figure 2:
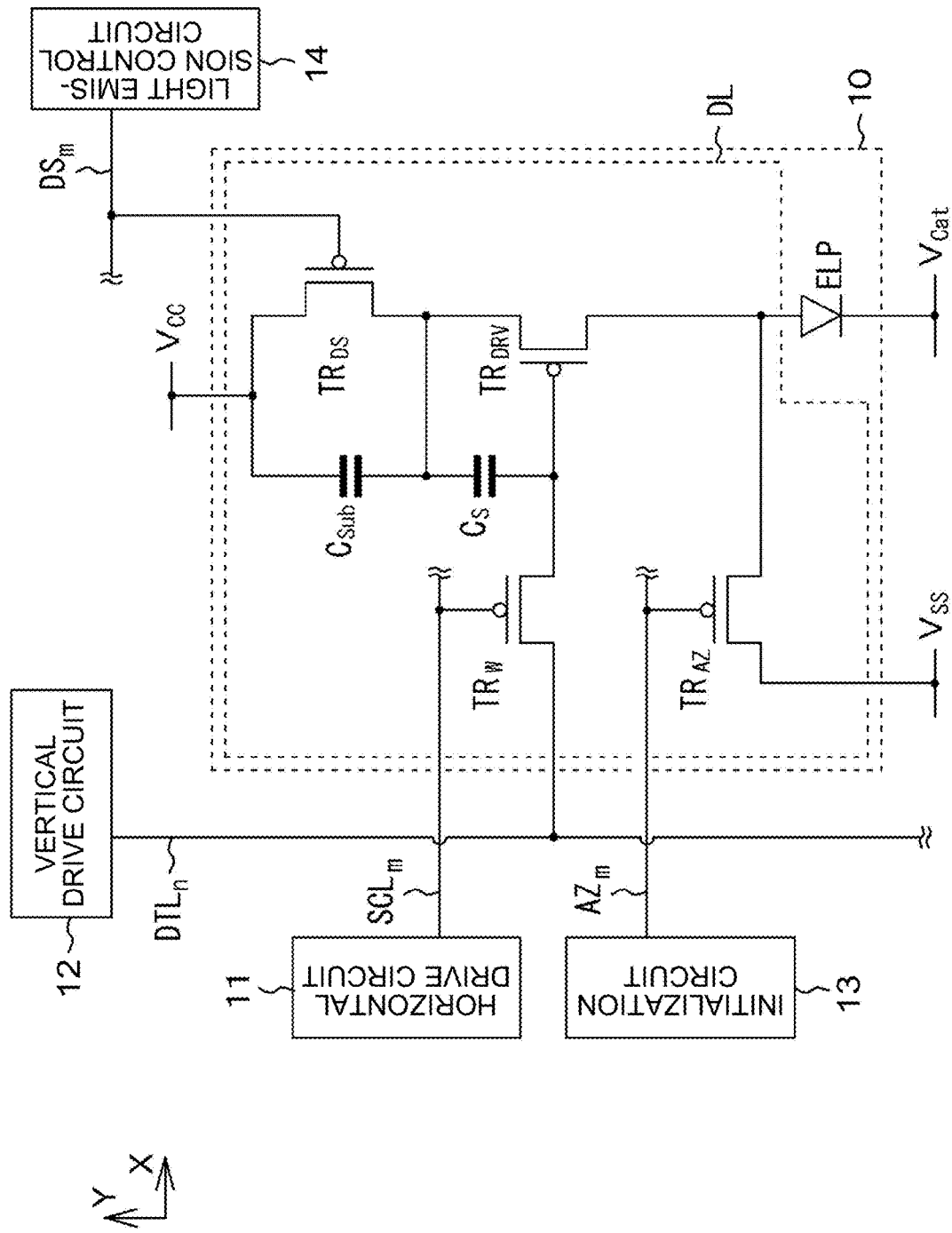
FIG. 2 is a schematic circuit diagram of an (n, m)-th pixel (display element).

FIG. 2 is a schematic circuit diagram of an (n, m)-th pixel (display element).

As illustrated in FIG. 2, the pixel 10 includes a current-driven light emitting element ELP and a drive circuit DL for driving the light emitting element ELP.

Although described in detail later with reference to FIGS. 3 to 14, the drive circuits DL are arranged in an array pattern on the semiconductor substrate. The semiconductor substrate has a common well region, and the drive circuits DL are arranged in the common well region. In a drive circuit group including a plurality of the drive circuits DL that are adjacent to each other, a well tap is provided in a part of the drive circuits of the plurality of the drive circuits included in the drive circuit group.

As illustrated in FIG. 2, the drive circuit DL includes four transistors and two capacitors. A reference sign $TR_W$ denotes a write transistor for writing a video signal, and a reference sign $TR_{DRV}$ denotes a drive transistor that applies a current to the light emitting element ELP. In addition, a reference sign $TR_{AZ}$ denotes an initialization transistor for initializing an anode voltage of the light emitting element ELP, and a reference sign $TR_{DS}$ denotes a light emission control transistor TR arranged between the drive transistor $TR_{DRV}$ and a feed line to which a drive voltage $V_{CC}$ is supplied. These are constituted by p-channel transistors.

In the light emission control transistor $TR_{DS}$, one source/drain region is connected to the feed line to which the drive voltage $V_{CC}$ is supplied and one electrode of a capacitor $C_{Sub}$. In addition, the other source/drain region is connected to one source/drain region of the drive transistor $T_{DRV}$ and the other electrode of the capacitor $C_{Sub}$. Conductive state/non-conductive state of the light emission control transistor $TR_{DS}$ is controlled by a control signal supplied to the control line $DS_m$ connected to a gate electrode.

A capacitor $C_s$ is connected between a gate electrode and one source/drain region of the drive transistor $T_{DRV}$. In addition, the other source/drain region of the drive transistor $T_{DRV}$ is connected to an anode electrode of the light emitting element ELP. A cathode electrode of the light emitting element ELP is connected to a feed line to which a voltage $V_{Cst}$ (e.g., ground potential) is supplied. The light emitting element ELP includes an organic electroluminescence element.

In the write transistor $TR_W$, one source/drain region is connected to the data line $DTL_n$. In addition, the other source/drain region is connected to the gate electrode of the drive transistor $T_{DRV}$. Conductive state/non-conductive state of the write transistor $TR_W$ is controlled by a scanning signal supplied to the scanning line $SCL_m$ connected to a gate electrode.

In the initialization transistor $TR_{AZ}$, one source/drain region is connected to a feed line to which a predetermined voltage $V_{SS}$ (e.g., ground potential) is supplied. In addition, the other source/drain region is connected to the anode electrode of the light emitting part ELP. Conductive state/non-conductive state of the initialization transistor $TR_{AZ}$ is controlled by a control signal supplied to the control line $AZ_m$ connected to a gate electrode.

Basic operation of the drive circuit DL will be described. In a state where the light emission control transistor $TR_{DS}$ is brought into a non-conductive state, the initialization transistor $TR_{AZ}$ is brought into a conductive state, and the anode voltage of the light emitting element ELP is initialized. Next, the write transistor $TR_W$ is brought into a conductive state, and a signal voltage is applied from the data line DTL to the gate electrode of the drive transistor $TR_{DRV}$. The capacitor $C_s$ holds a voltage corresponding to the signal voltage. $V_{gs}$ (potential difference between the gate electrode and the source region) of the drive transistor $TR_{DRV}$ is held by the capacitor $C_s$.

Next, the write transistor $TR_W$ is brought into a non-conductive state, and the light emission control transistor $TR_{DS}$ is brought into a conductive state. Through the drive transistor $TR_{DRV}$, a current represented by the following equation (1) flows in accordance with $V_{gs}$ held in the capacitor $C_s$:

where, for the drive transistor $TR_{DRV}$,
μ: effective mobility,
L: channel length,
W: channel width,
$V_{gs}$: potential difference between gate electrode and source region,
$V_{th}$: threshold voltage,
$C_{ox}$: (relative dielectric constant of gate insulating layer) '(dielectric constant of vacuum)/(thickness of gate insulating layer), and $$k \equiv (1/2) \cdot (W/L) \cdot C_{ox}. \qquad (1)$$
$$I_{ds} = k \cdot \mu \cdot (V_{gs} - V_{th})^2$$

When the drain current $I_{ds}$ flows through the light emitting element ELP, the light emitting element ELP emits light. Furthermore, the light emission state (brightness) of the light emitting element is controlled by the magnitude of the value of the drain current $I_{ds}$.

The basic configuration of the pixel 10 has been described above. Next, a three-dimensional arrangement relationship of various components constituting the display device 1 will be described.

Figure 3:
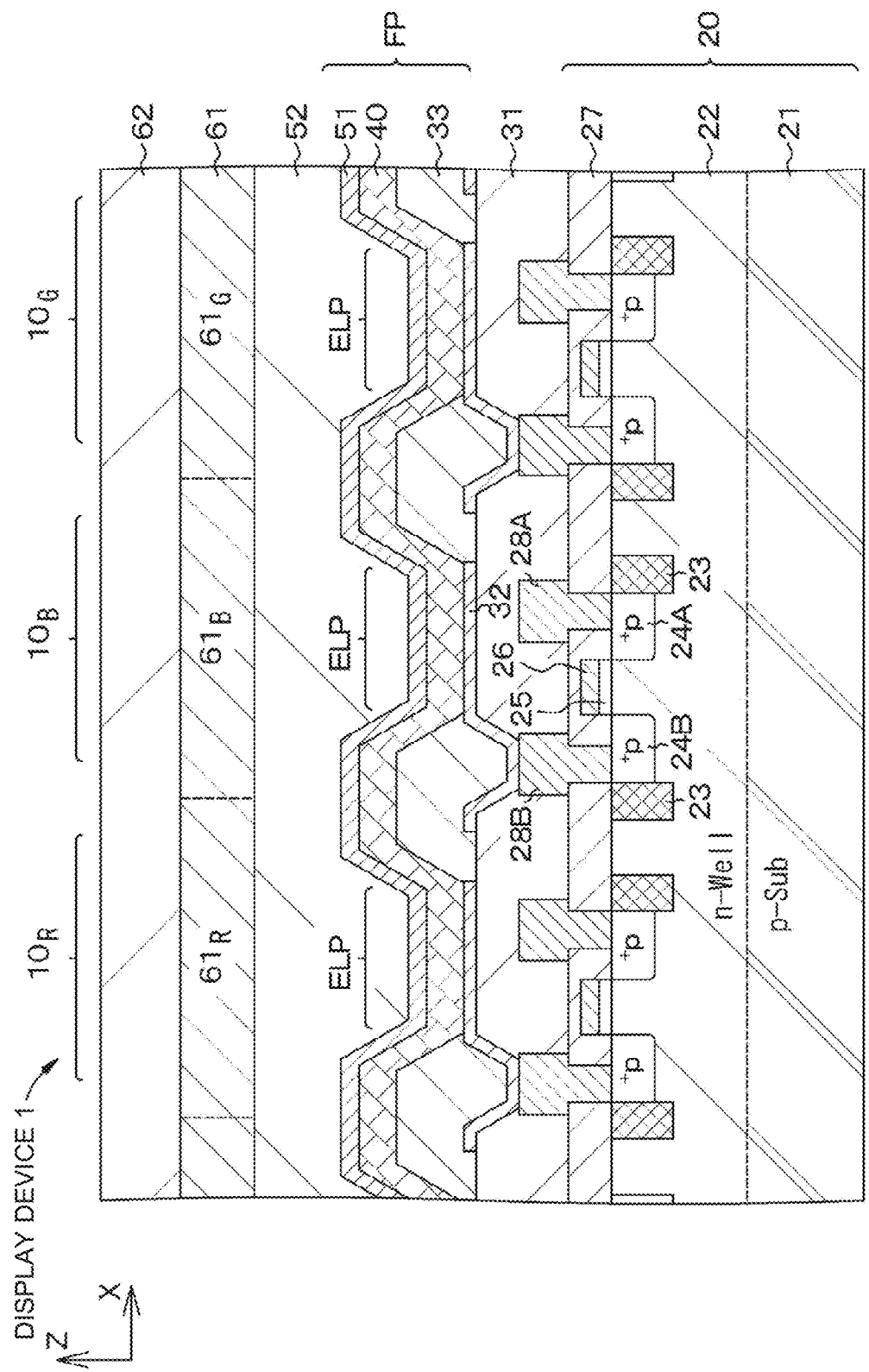
FIG. 3 is a schematic partial cross-sectional view of a portion including a pixel (display element) in the display device.

FIG. 3 is a schematic partial cross-sectional view of a portion including the pixel (display element) in the display device.

First, a drive circuit array substrate 20 will be described. A reference sign 21 denotes a p-type substrate made of, for example, silicon. Then, an n-type common well region 22 is formed on the substrate 21. The various transistors of the drive circuit DL are arranged in the common well region 22. Note that, for convenience of illustration, only the drive transistor $TR_{DRV}$ is illustrated in FIG. 3. A reference sign 23 denotes an element isolation region that separates a transistor, and reference signs 24A, 24B denote a pair of source/drain regions of the drive transistor $TR_W$. A portion sandwiched by the pair of source/drain regions 24A, 24B forms a channel region.

A gate insulating film 25 is formed on the channel region, and a gate electrode 26 is formed thereon. The gate insulating film 25 can be formed using, for example, silicon oxide ($SiO_x$), silicon nitride ($SiN_x$), or the like. An interlayer insulating film 27 is formed on an entire surface including surfaces of the gate electrodes 26. The interlayer insulating film 27 can be formed using, for example, silicon oxide ($SiO_x$), silicon nitride ($SiN_x$), silicon oxynitride ($SiO_xN_y$), or the like. Source/drain electrodes 28A, 28B are connected to the source/drain regions of the transistors via openings provided in the interlayer insulating film 27. A flattening film 31 is formed on an entire surface including surfaces of the source/drain electrodes 28A, 28B. The flattening film 31 is formed by laminating various material layers, and includes various wirings, electrodes, and the like, but they are omitted in the view.

An anode electrode 32 of the light emitting element ELP is formed on the flattening film 31. The anode electrode 32 is connected to the other source/drain electrode 28B of the drive transistor $TR_{DRV}$ via an opening provided in the flattening film 31. A reference sign 33 denotes a partition that separates the adjacent anode electrodes 32.

Over an entire surface including surfaces of the anode electrodes 32 and the partitions 33, an organic layer 40 formed by laminating a plurality of material layers and a cathode electrode 51 made of a transparent conductive material are formed. The anode electrode 32, the organic layer 40, and the cathode electrode 51 are laminated to form the light emitting element ELP. In the display device 1, a portion where the light emitting elements ELP are configured is represented by a reference sign FP.

A protective film 52 is formed on the cathode electrode 51. The protective film 52 can be formed using, for example, an organic insulating film such as a polyimide-based resin, an acrylic-based resin, or a novolac-based resin, or an inorganic insulating film such as silicon oxide ($SiO_x$), silicon nitride ($SiN_x$), or silicon oxynitride ($SiO_xN_y$). A color filter 61 corresponding to a color to be displayed and a transparent substrate 62 are sequentially laminated over the protective film 52. The light emitted in the organic layer 40 passes through the color filter 61 and the transparent substrate 62 to be emitted to the outside.

The three-dimensional arrangement relationship of the various components constituting the display device 1 has been described above. Subsequently, a circuit arrangement of the drive circuits in the drive circuit array substrate will be described.

Figure 4A:
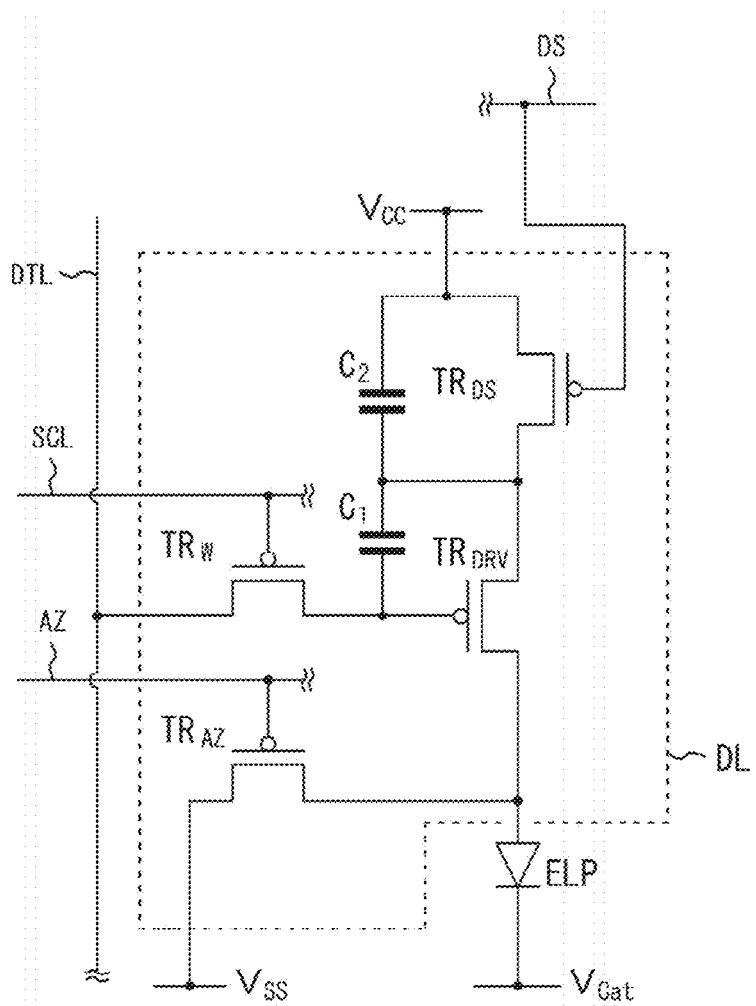
FIG. 4A is a circuit diagram for explaining a relationship between a circuit diagram of a drive circuit and an actual circuit arrangement.
Figure 4B:
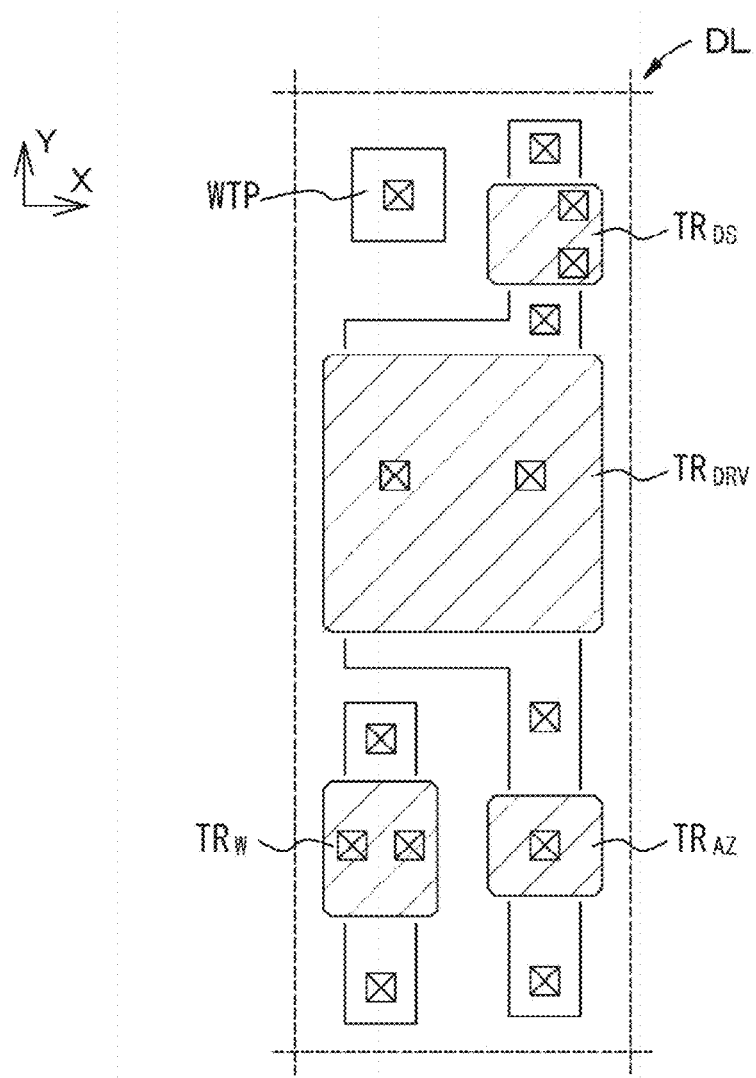
FIG. 4B is a view for explaining the relationship between the circuit diagram of the drive circuit and the actual circuit arrangement, and is a plan view for explaining a basic element arrangement.

FIGS. 4A and 4B are views for explaining a relationship between a circuit diagram of the drive circuit and an actual circuit arrangement. FIG. 4A illustrates the circuit diagram. FIG. 4B is a plan view for explaining a basic element arrangement.

FIG. 4B illustrates basic arrangement of the transistors included in the drive circuit DL. The transistor included in the drive circuit DL is formed in a predetermined section in the common well region. A hatched portion indicates a gate electrode located on a channel region of each transistor. A reference sign WTP denotes a well tap for supplying a voltage to the well region.

Here, in order to help understand the present disclosure, a circuit arrangement and the like in a drive circuit array substrate of a reference example will be described.

Figure 5:
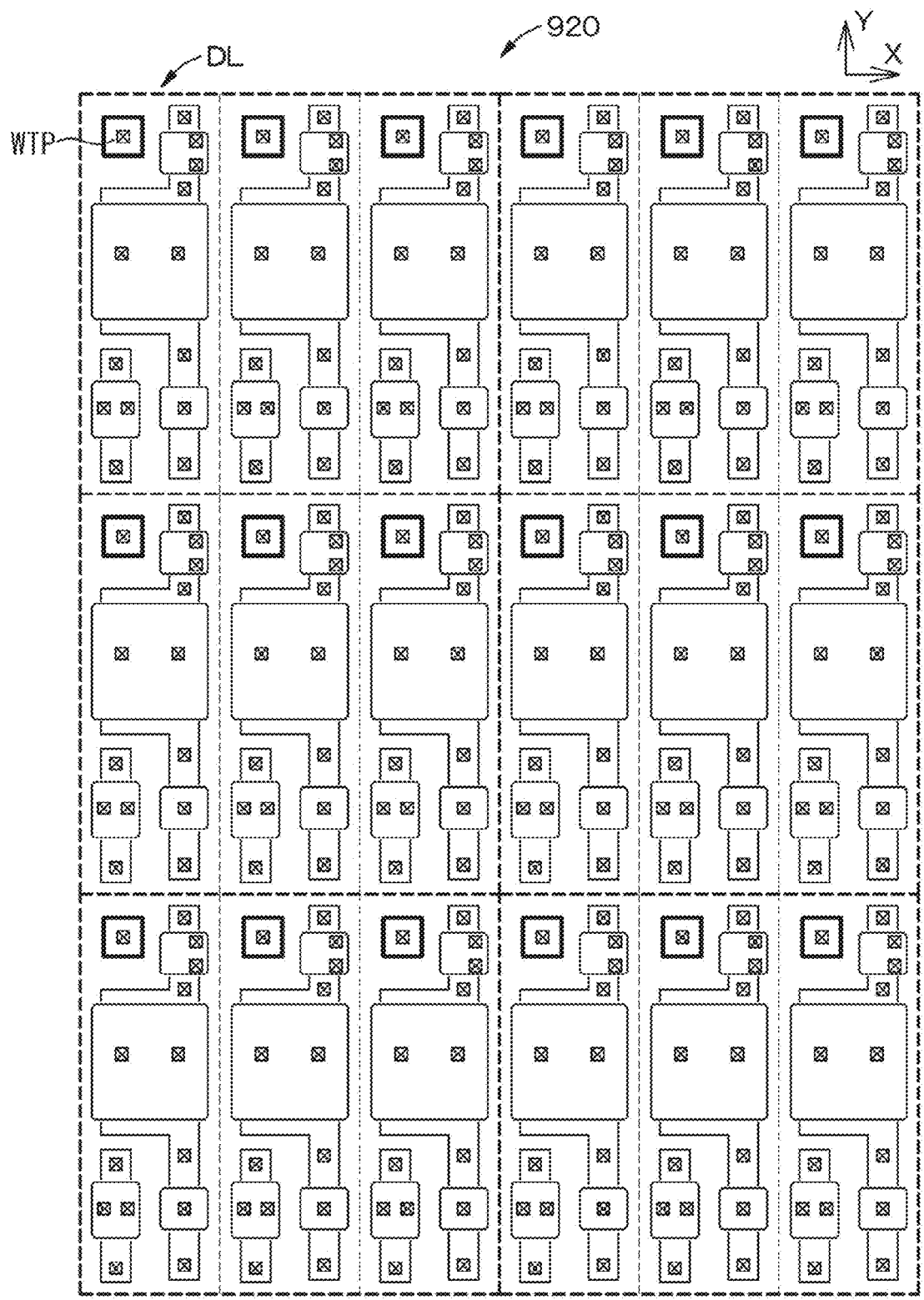
FIG. 5 is a schematic partial plan view of a substrate and the like for explaining a circuit arrangement in a drive circuit array substrate of a reference example.
Figure 6:
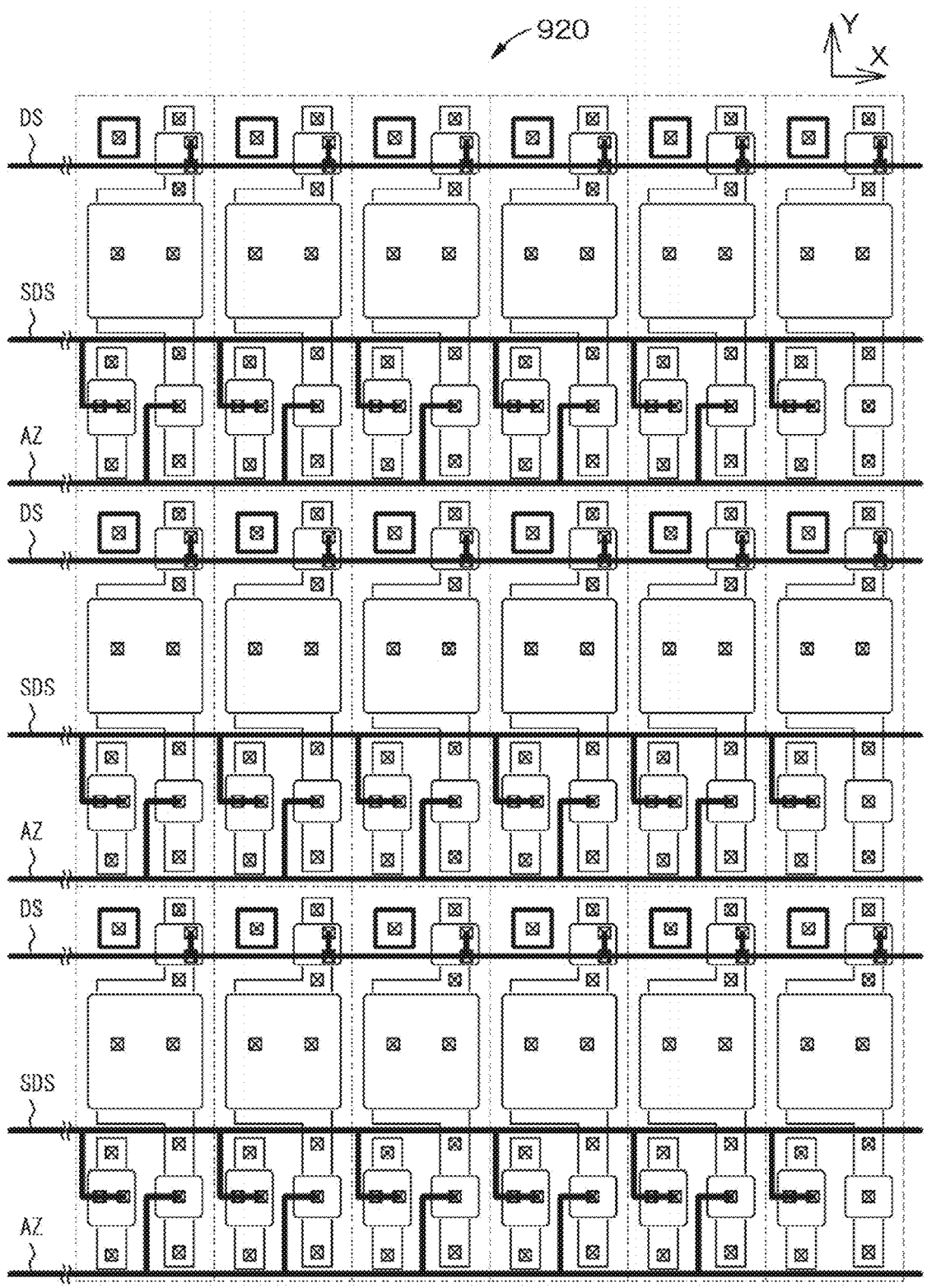
FIG. 6 is a schematic partial plan view of a substrate and the like for explaining an arrangement of various control lines in the drive circuit array substrate of the reference example.

FIG. 5 is a schematic partial plan view of a substrate and the like for explaining a circuit arrangement in the drive circuit array substrate of the reference example. FIG. 6 is a schematic partial plan view of the substrate and the like for explaining the arrangement of various control lines in the drive circuit array substrate of the reference example.

As illustrated in FIG. 5, the drive circuits DL each having the arrangement illustrated in FIG. 4B are arranged in an array pattern in a drive circuit array substrate 920 of the reference example. The respective drive circuits have the same arrangement relationship, and a well tap WTP is provided in the region of every drive circuit DL.

The inventor has paid attention to the fact that the potential of the well region can be kept even if the well taps WTP are omitted for some of the drive circuits, and that a transistor of the drive circuit can be configured to have a larger size by reducing the region occupied by the well tap WTP.

Figure 7:
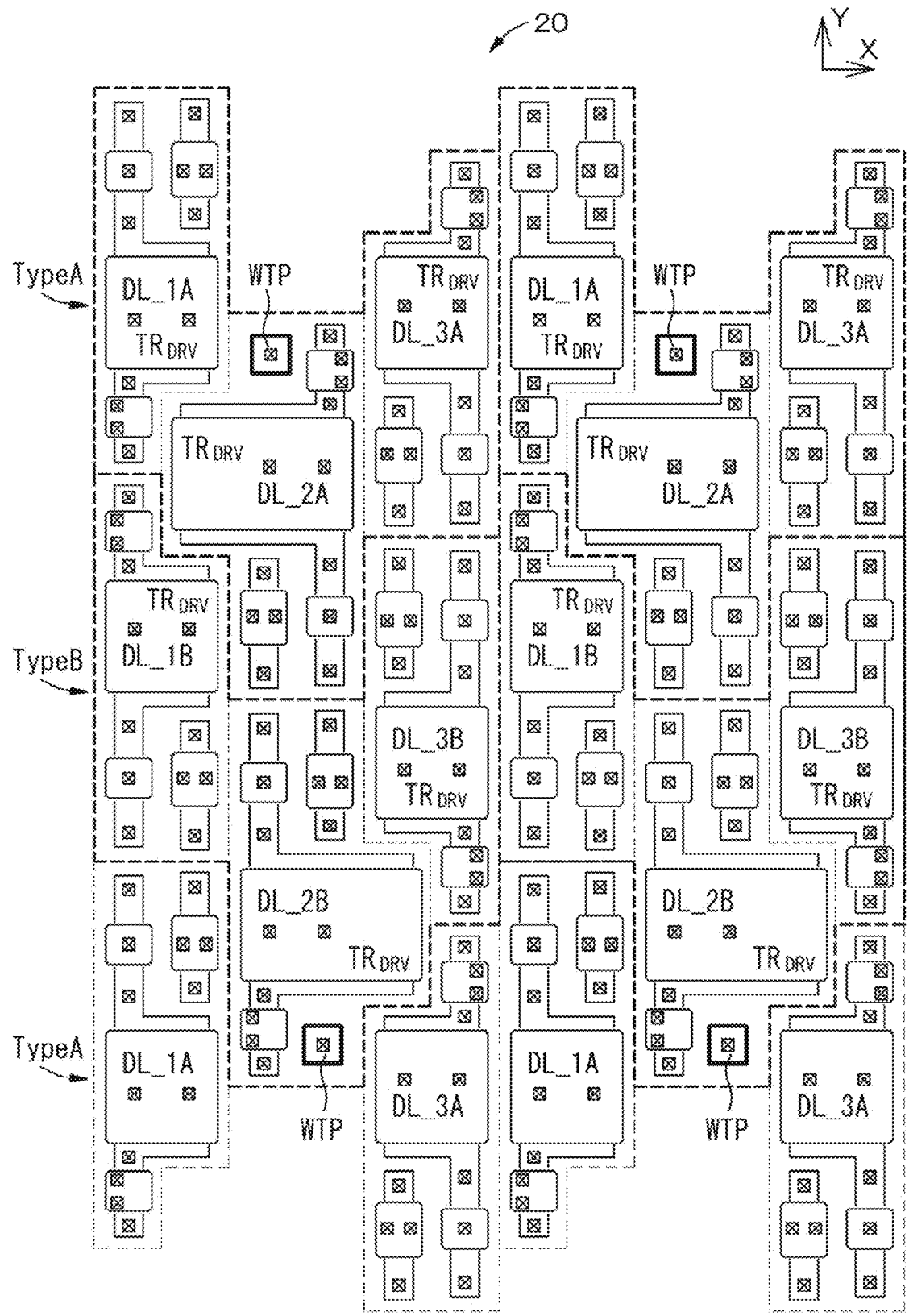
FIG. 7 is a schematic partial plan view of a substrate and the like for explaining a circuit arrangement in a drive circuit array substrate according to the first embodiment.

FIG. 7 is a schematic partial plan view of a substrate and the like for explaining a circuit arrangement in the drive circuit array substrate according to the first embodiment.

In the drive circuit array substrate 20, the well tap WTP is provided, in a drive circuit group including a plurality of drive circuits that are adjacent to each other, in a part of the drive circuits of the plurality of the drive circuits included in the drive circuit group, as illustrated in FIG. 7.

In the plurality of the drive circuits included in the drive circuit group, a transistor constituting a predetermined drive circuit is configured to have a larger size than transistors of the other drive circuits. In addition, in the plurality of the drive circuits included in the drive circuit group, the well tap is provided in a predetermined drive circuit. Note that the respective drive circuits are arrayed in a stripe pattern extending in the column direction.

In the drive circuit array substrate 20,
the drive circuit group includes a first drive circuit, a second drive circuit, and a third drive circuit,
the second drive circuit is arranged to be sandwiched by the first drive circuit and the third drive circuit,
the well tap is provided in the second drive circuit, and
a transistor constituting the second drive circuit is configured to have a larger size than transistors of the first drive circuit and the third drive circuit, as described below.

That is, in a drive circuit group denoted by a reference sign TypeA including a first drive circuit DL_1A, a second drive circuit DL_2A, and a third drive circuit DL_3A, the well tap WTP is provided only in the second drive circuit DL_2A. In addition, in a drive circuit group denoted by a reference sign TypeB including a first drive circuit DL_1B, a second drive circuit DL_2B, and a third drive circuit DL_3B, the well tap WTP is provided only in the second drive circuit DL_2B.

In the drive circuit array substrate 20, the third drive circuit has, in the drive circuit groups, a circuit arrangement in which the first drive circuit is vertically and horizontally inverted. That is, the third drive circuit DL_3A has a circuit arrangement in which the first drive circuit DL_1A is vertically and horizontally inverted. In addition, the third drive circuit DL_3B has a circuit arrangement in which the first drive circuit DL_1B is vertically and horizontally inverted.

Then, a pair of the drive circuit groups (drive circuit group TypeA and drive circuit group TypeB) adjacent to each other and side by side in a longitudinal direction (Y direction in the view) of the drive circuit are arranged to form a repeating unit.

The first drive circuit and the third drive circuit belonging to one drive circuit group of the pair of the drive circuit groups have circuit arrangements in which the first drive circuit and the third drive circuit belonging to the other drive circuit group are vertically inverted, respectively. That is, the first drive circuit DL_1B and the third drive circuit DL_3B of the drive circuit group TypeB have circuit arrangements in which the first drive circuit DL_1A and the third drive circuit DL_3A belonging to the drive circuit group TypeA are vertically inverted, respectively.

In addition, the second drive circuit belonging to one drive circuit group of the pair of the drive circuit groups has a circuit arrangement in which the second drive circuit belonging to the other drive circuit group is vertically and horizontally inverted. That is, the second drive circuit DL_2B of the drive circuit group TypeB has a circuit arrangement in which the second drive circuit DL_2A belonging to the drive circuit group TypeA is vertically and horizontally inverted.

In a region where the well tap WTP is omitted in each of the drive circuit DL_1A and the drive circuit DL_1B, a drive transistor configured to have a larger size is arranged in the second drive circuit DL_2A. Similarly, in a region where the well tap WTP is omitted in each of the drive circuit DL_3B and the drive circuit DL_3A, a drive transistor configured to have a larger size is arranged in the second drive circuit DL_2B. As described above, a transistor for supplying a current, of the transistors constituting a predetermined drive circuit, is configured to have a larger size.

A general equation for a variation $\sigma V_{th}$ in the threshold voltage of a transistor is represented by the following equation (2).

$$\sigma V_{th} = (q/3\varepsilon_0)^{1/2} \cdot (T_{INV} \cdot (V_{th} + V_0)/(L \cdot W))^{1/2} \quad (2)$$

where
q: elementary charge,
$\varepsilon_0$: dielectric constant of vacuum,
$T_{INV}$: oxide film thickness,
$V_{th}$: threshold voltage,
$V_0$: $-V_{FB} - 2\Phi$
($V_{FB}$ is a flat band potential, $\Phi$ is a difference between a Fermi level and a true Fermi level),
L: channel length, and
W: channel width.

As is clear from the above equation (2), the variation in the threshold voltage can be reduced by configuring the transistor to have a larger size so as to increase the channel length L and the channel width W.

In the display device 1 illustrated in FIG. 1, the first drive circuits DL_1A, 1B and the third drive circuits DL_3A, 3B are connected to a light emitting element corresponding to a red pixel and a light emitting element corresponding to a blue pixel, respectively, and the second drive circuits DL_2A, 2B are each connected to a light emitting element corresponding to a green pixel. Green has a relatively higher luminosity factor than red and blue. Therefore, when the drive transistor $TR_{DRV}$, included in the second drive circuits DL_2A, 2B that supply a current to the green light emitting element, is configured to have a larger size, unevenness in brightness can be more effectively reduced.

Subsequently, a transition from the arrangement of the drive circuits of the reference example to the arrangement of the drive circuits of the first embodiment will be described with reference to FIGS. 8A to 11B.

Figure 8A:
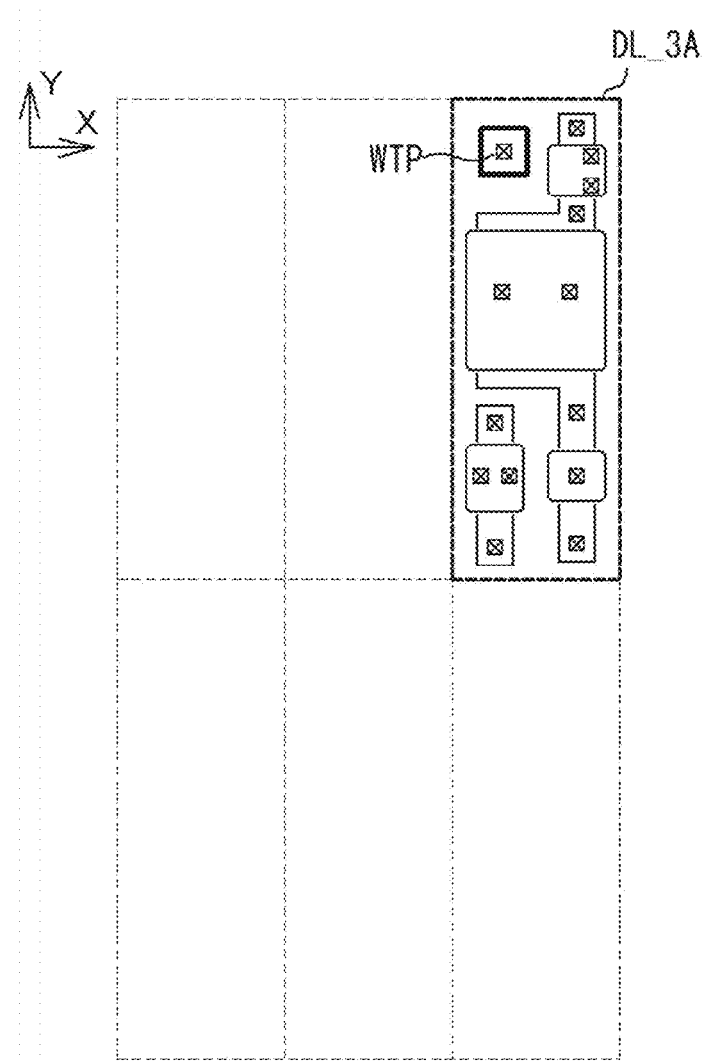
FIG. 8A is a schematic plan view for explaining an arrangement relationship of drive circuit groups in the drive circuit array substrate according to the first embodiment.
Figure 8B:
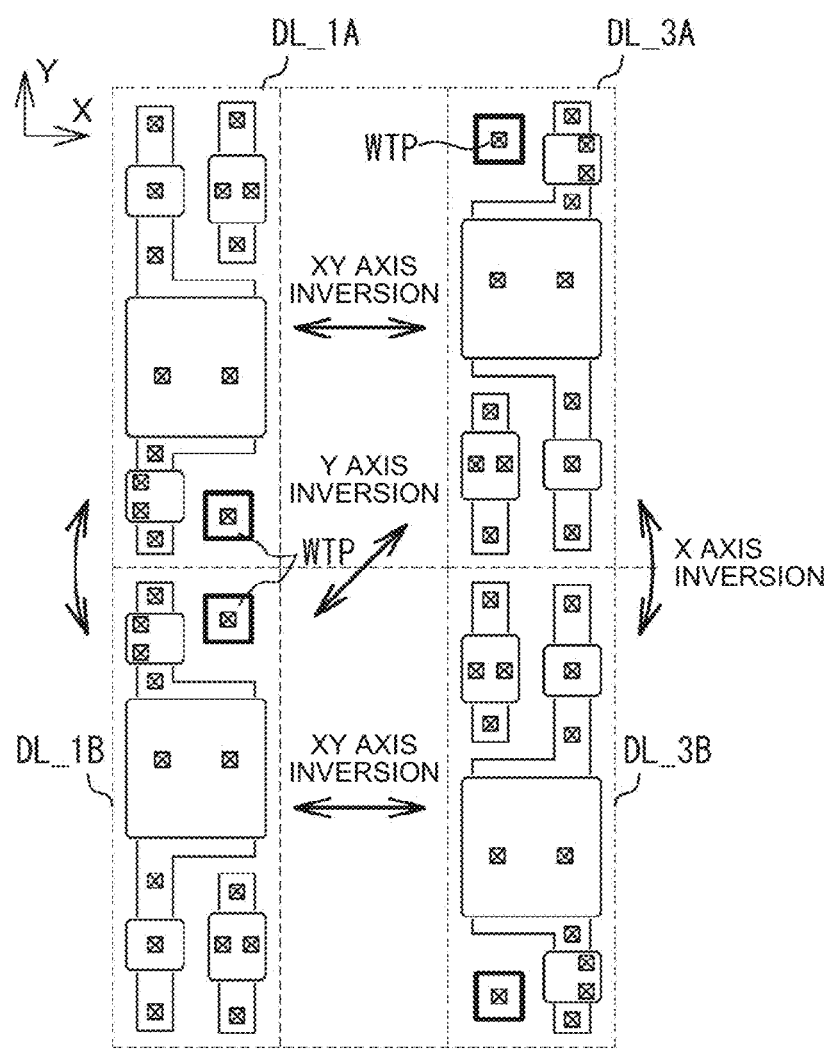
FIG. 8B is a schematic plan view for explaining the arrangement relationship of the drive circuit groups in the drive circuit array substrate according to the first embodiment.

As illustrated in FIG. 8A, the third drive circuit DL_3A located on the right side of the upper drive pixel group, of the pair of drive pixel groups of the reference example, is considered as a reference. As illustrated in FIG. 8B, the first drive circuit DL_1A of the upper drive pixel group is configured to have a circuit arrangement in which the third drive circuit DL_3A is vertically and horizontally inverted. In addition, the first drive circuit DL_1B and the third drive circuit DL_3B of the lower drive pixel group are configured to have circuit arrangements in which the circuits of the upper drive pixel group are inverted in the vertical direction, respectively. In the example illustrated in FIG. 8B, the well taps WTP of the first drive circuits DL_1A, 1B in the upper and lower drive pixel groups are adjacent to each other.

Figure 9A:
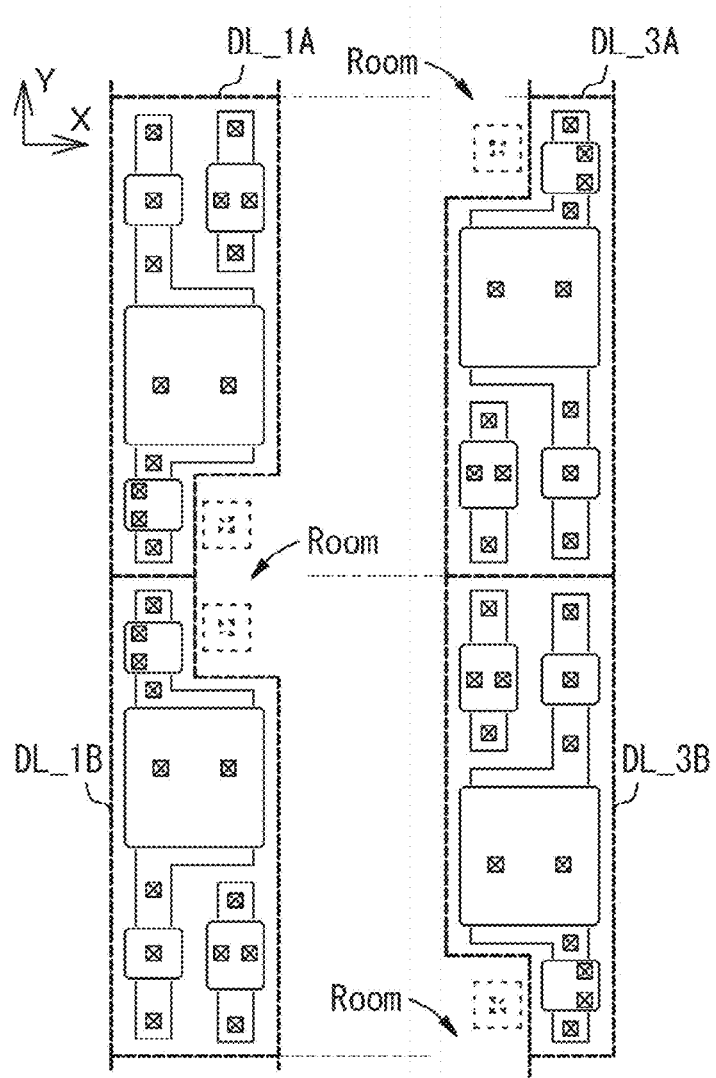
FIG. 9A is a schematic plan view for explaining the arrangement relationship of the drive circuit groups in the drive circuit array substrate according to the first embodiment, following FIG. 8B.
Figure 9B:
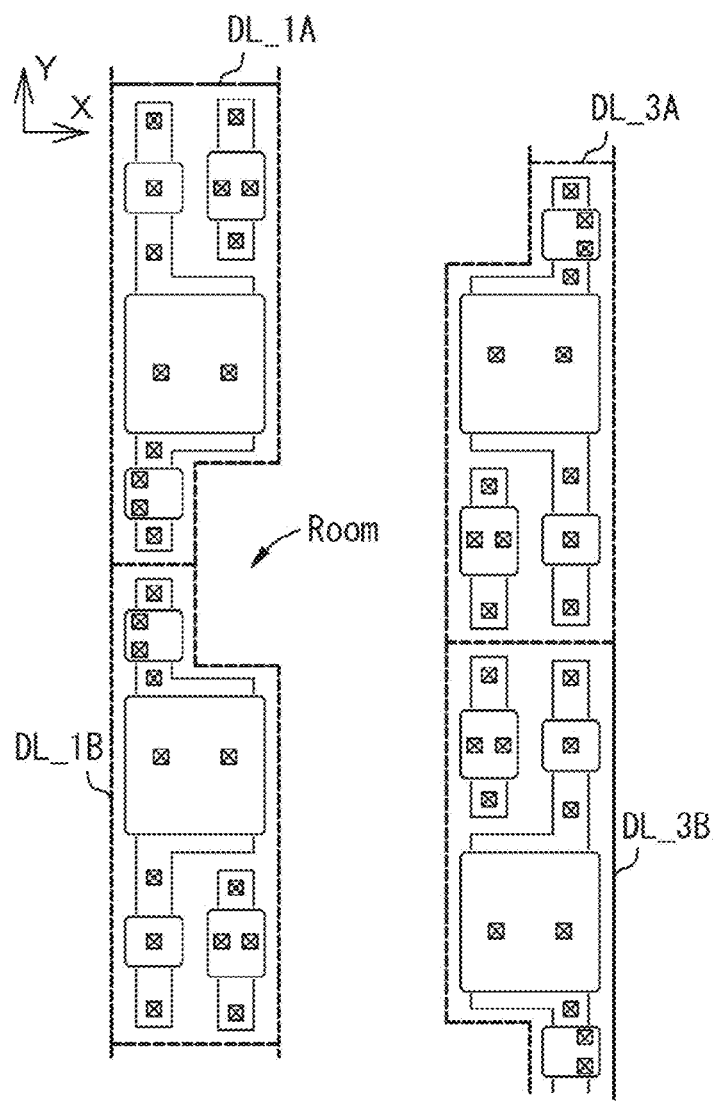
FIG. 9B is a schematic plan view for explaining the arrangement relationship of the drive circuit groups in the drive circuit array substrate according to the first embodiment, following FIG. 8B.

Next, the well tap WTP of each drive circuit is omitted, as illustrated in FIG. 9A. As a result, there is room in a region where the second drive circuit is to be provided. The room generated by the omission of the well taps WTP is denoted by a reference sign Room. Thereafter, the third drive circuits DL_3A, 3B are shifted by a predetermined amount in the column direction with respect to the first drive circuits DL_1A, 1B, as illustrated in FIG. 9B.

Figure 10A:
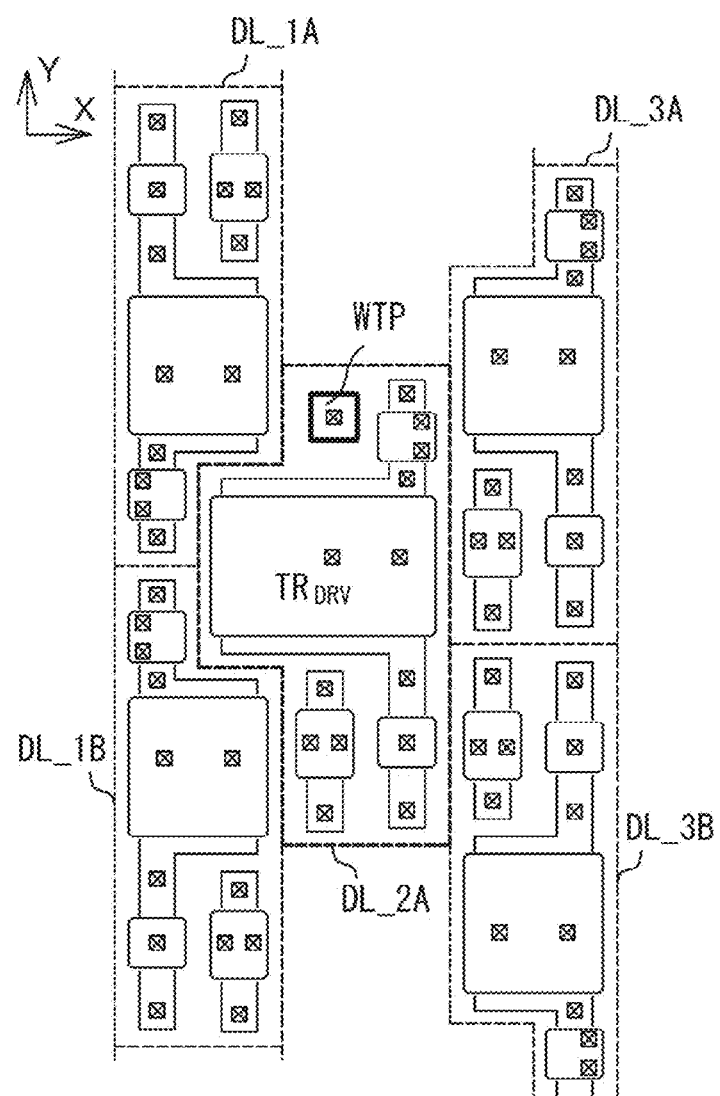
FIG. 10A is a schematic plan view for explaining the arrangement relationship of the drive circuit groups in the drive circuit array substrate according to the first embodiment, following FIG. 9B.
Figure 10B:
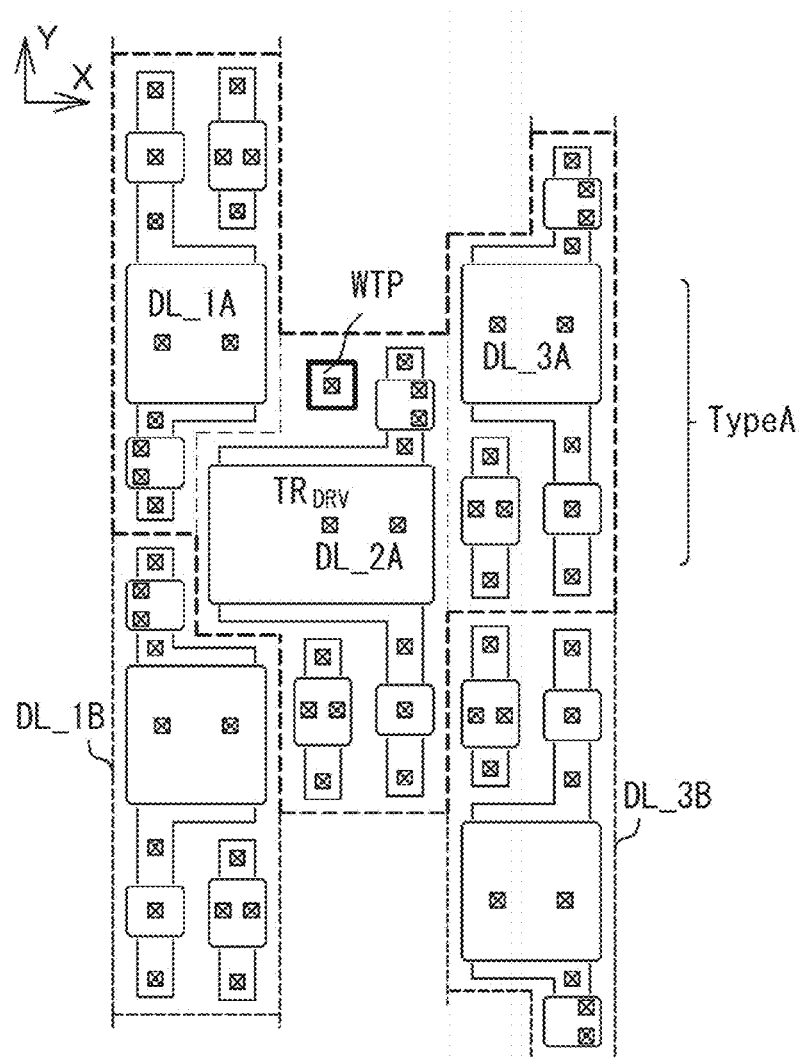
FIG. 10B is a schematic plan view for explaining the arrangement relationship of the drive circuit groups in the drive circuit array substrate according to the first embodiment, following FIG. 9B.

Then, the second drive circuit DL_2A, having the well tap WTP and having a drive transistor configured to have a larger size, is arranged between the first drive circuits DL_1A, 1B and the third drive circuits DL_3A, 3B, as illustrated in FIG. 10A. As a result, a drive circuit group denoted by the reference sign TypeA is formed, as illustrated in FIG. 10B.

Figure 11A:
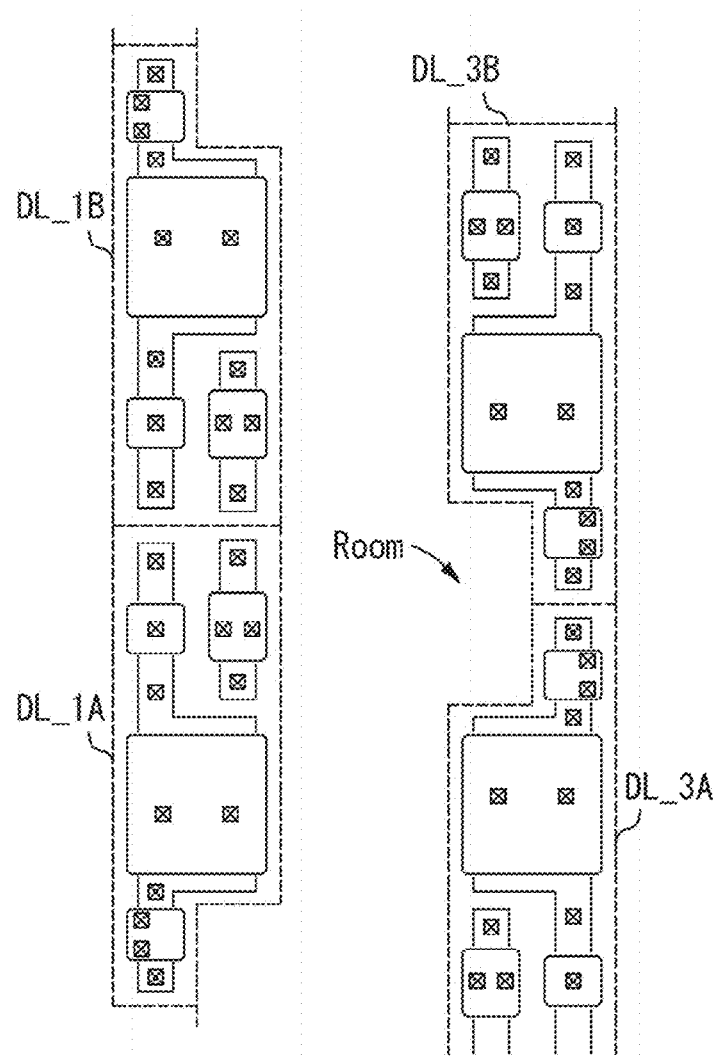
FIG. 11A is a schematic plan view for explaining the arrangement relationship of the drive circuit groups in the drive circuit array substrate according to the first embodiment, following FIG. 10B.
Figure 11B:
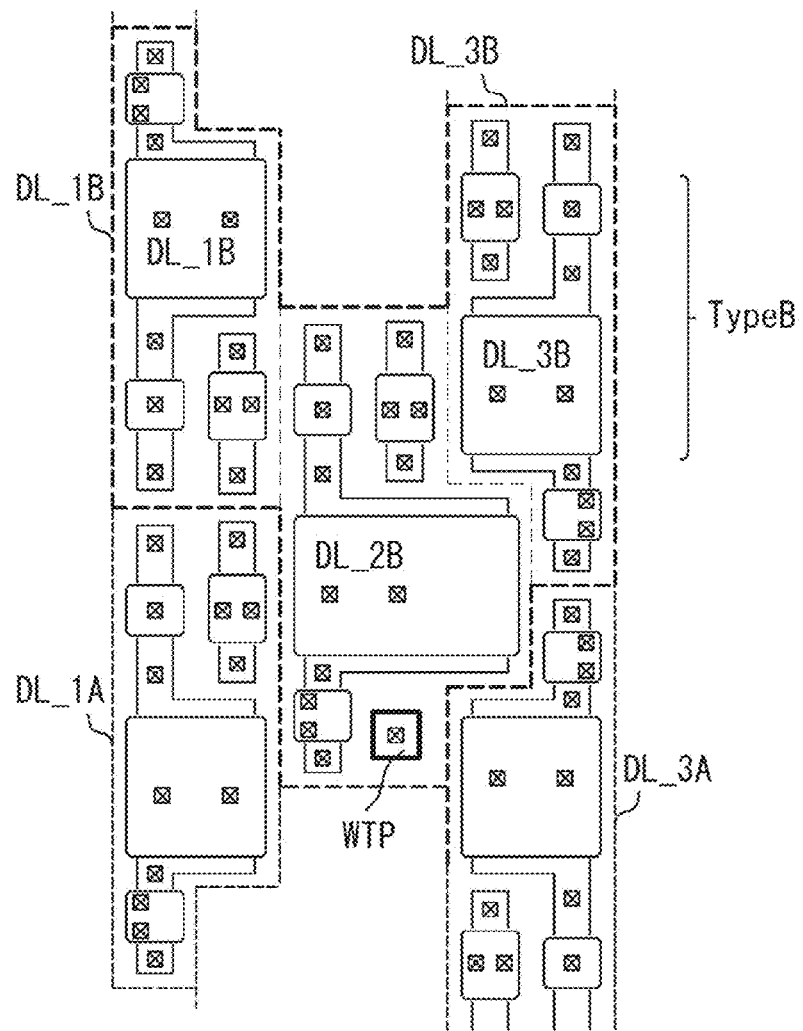
FIG. 11B is a schematic plan view for explaining the arrangement relationship of the drive circuit groups in the drive circuit array substrate according to the first embodiment, following FIG. 10B.

FIGS. 11A and 11B are views for explaining a drive circuit group located above or below the drive circuit group denoted by the reference sign TypeA. In the example illustrated in FIG. 11A, the well taps WTP of the third drive circuits DL_3B, 3A in the upper and lower drive pixel groups are omitted in a state of being adjacent to each other. As illustrated in FIG. 11B, the second drive circuit DL_2B, having the well tap WTP and having a drive transistor configured to have a larger size, is arranged between the first drive circuits DL_1B, 1A and the third drive circuits DL_3B, 3A. In the example illustrated in FIG. 11B, a drive circuit group denoted by the reference sign TypeB is formed.

Figure 12:
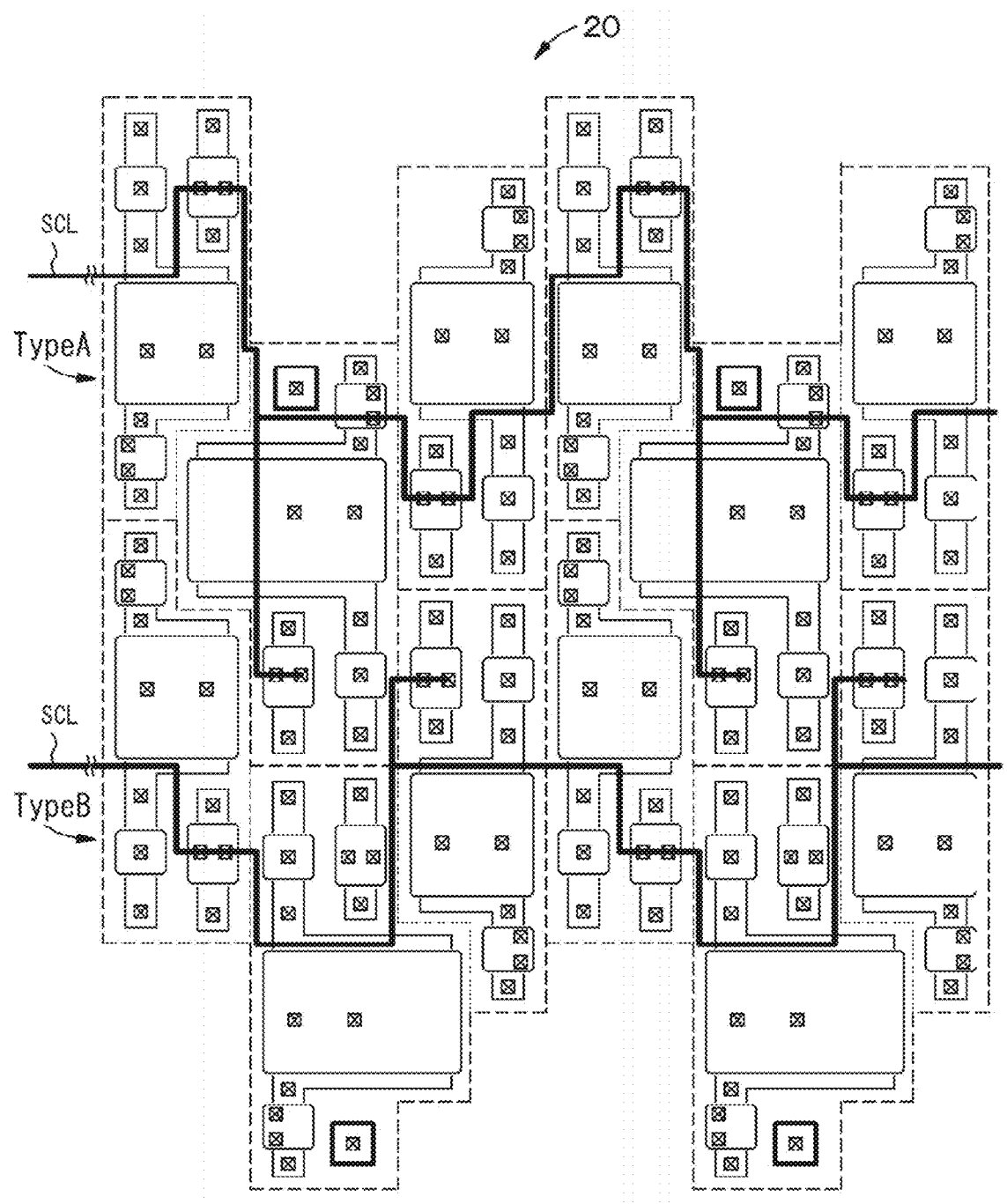
FIG. 12 is a schematic partial plan view of a substrate and the like for explaining an arrangement of various control lines in the drive circuit array substrate according to the first embodiment.
Figure 13:
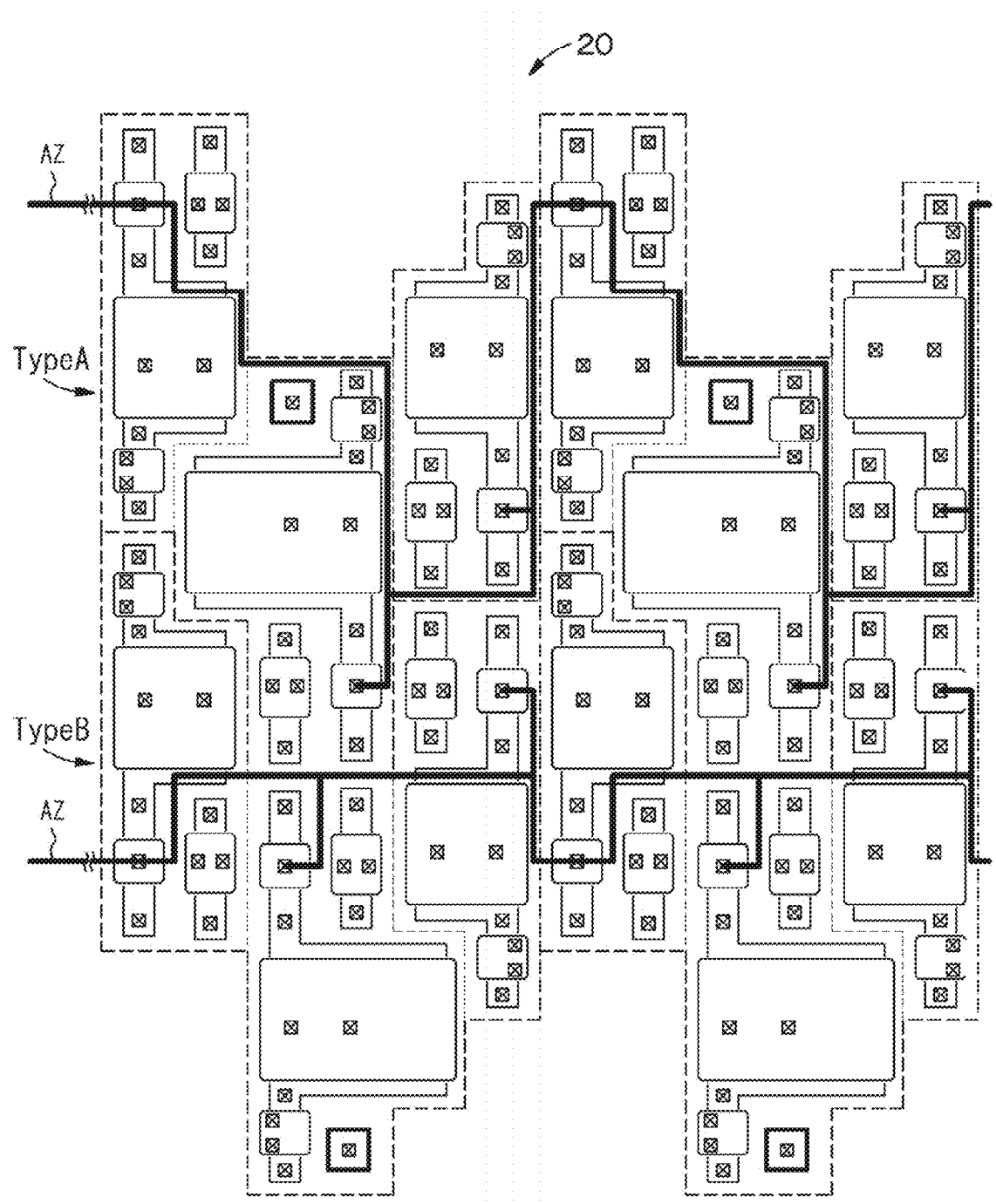
FIG. 13 is a schematic partial plan view of the substrate and the like for explaining the arrangement of the various control lines in the drive circuit array substrate according to the first embodiment, following FIG. 12.
Figure 14:
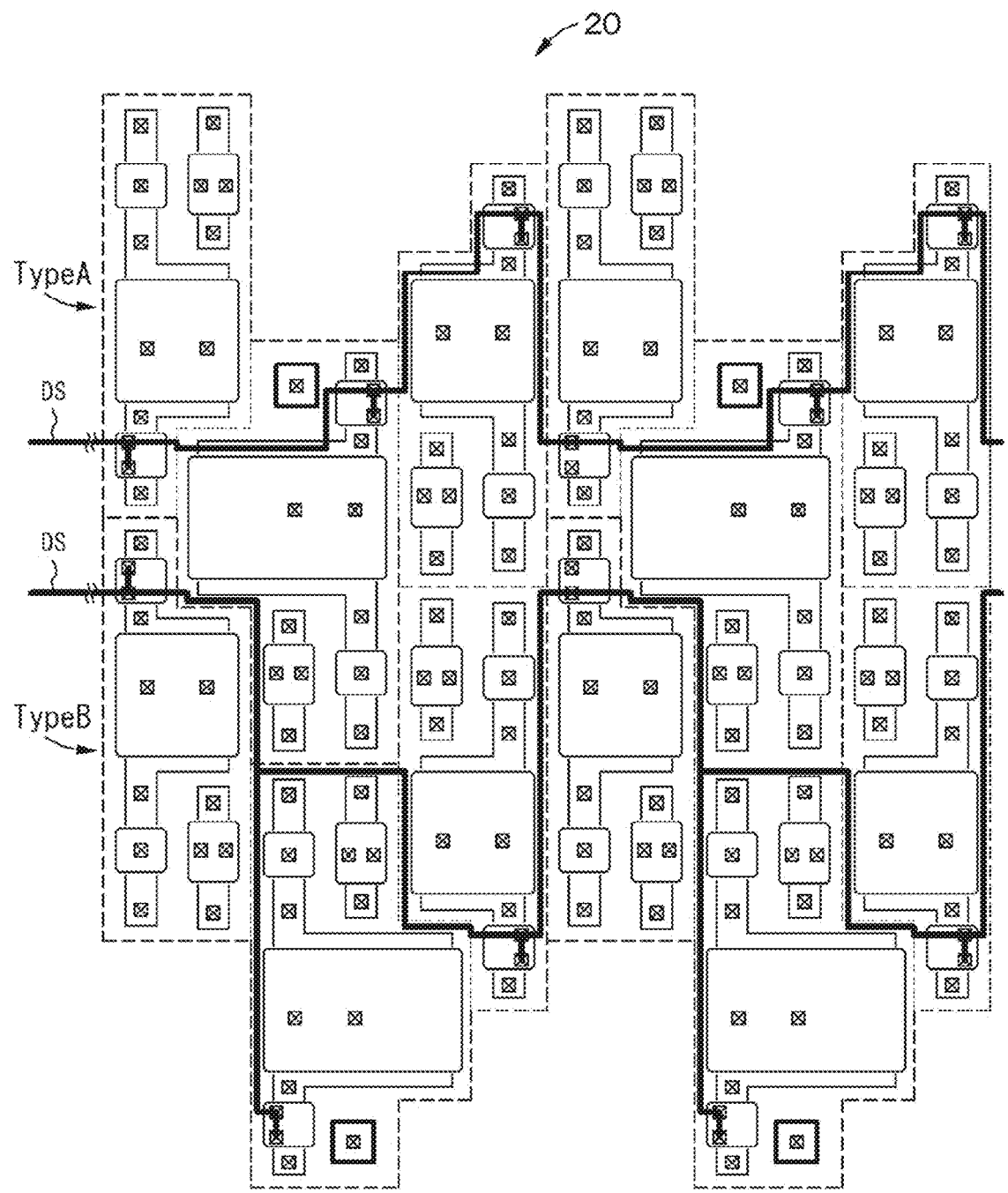
FIG. 14 is a schematic partial plan view of the substrate and the like for explaining the arrangement of the various control lines in the drive circuit array substrate according to the first embodiment, following FIG. 13.

In the drive circuit array substrate 20, planar arrangements of the respective drive circuits are not the same. Therefore, arrangements of the control lines and the like become more complicated than the drive circuit array substrate 920 of the reference example. FIGS. 12 to 15B illustrate the arrangements of the control lines and the like. FIG. 12 illustrates the arrangement of the scanning lines SCL, FIG. 13 illustrates the arrangement of the control lines AZ, and FIG. 14 illustrates the arrangement of the control lines DS. Note that illustration of the signal lines DTL is omitted.

The circuit arrangement of the drive circuits in the drive circuit array substrate has been described above.

Note that a planar arrangement of the light emitting element may or may not match a planar arrangement of the drive circuit. Depending on wiring between the anode electrode and the drive circuit, the light emitting element can be arranged in any plane. The respective light emitting elements can be arranged in, for example, a stripe array, a mosaic array, a square array, or a delta array.

Figure 15A:
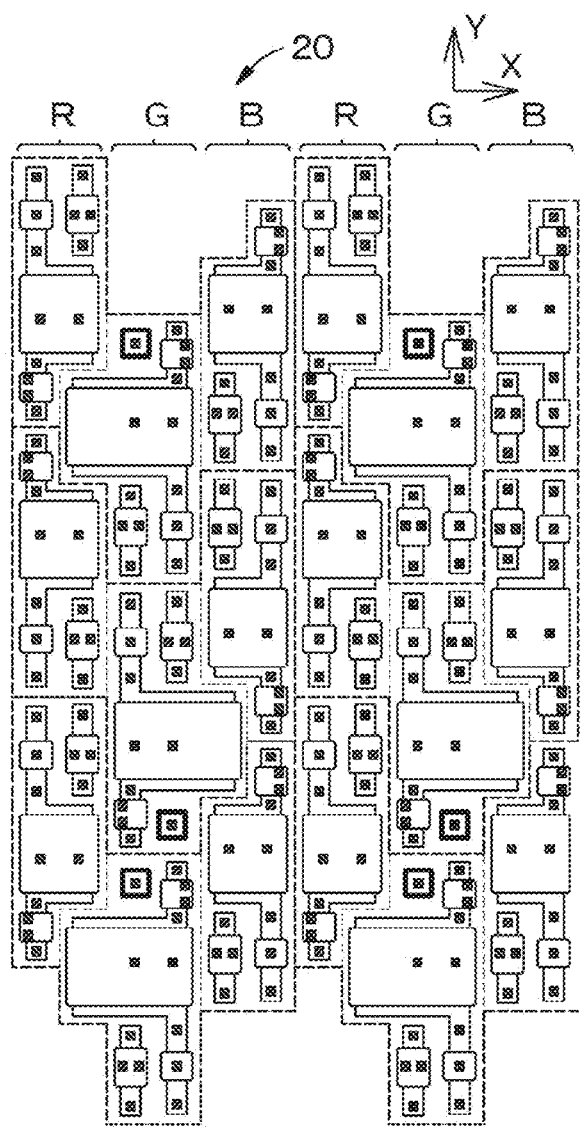
FIG. 15A is a view for explaining an example of an arrangement relationship between drive circuits and light emitting elements, and is a schematic partial plan view illustrating a circuit arrangement of the drive circuits.
Figure 15B:
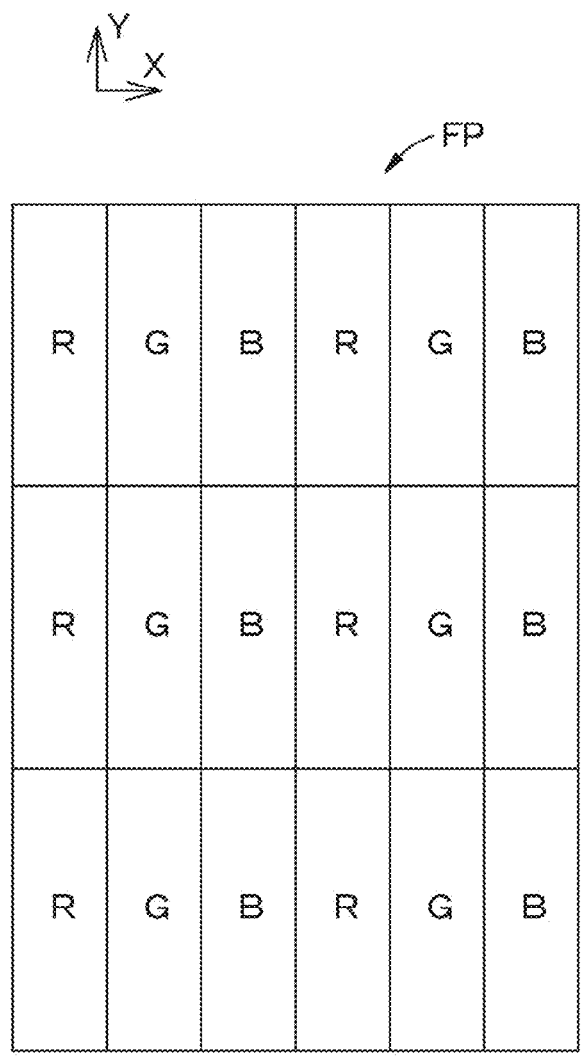
FIG. 15B is a view for explaining an example of an arrangement relationship between drive circuits and light emitting elements, and is a schematic partial plan view illustrating an arrangement of the light emitting elements.
Figure 16A:
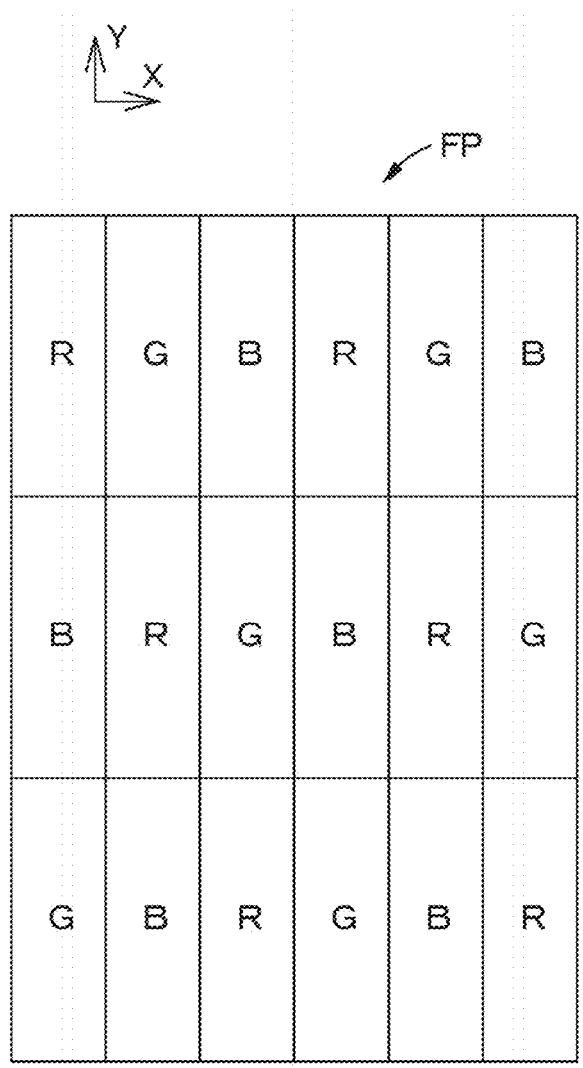
FIG. 16A is a schematic partial plan view illustrating the arrangement of the light emitting elements, following FIG. 15B.
Figure 16B:
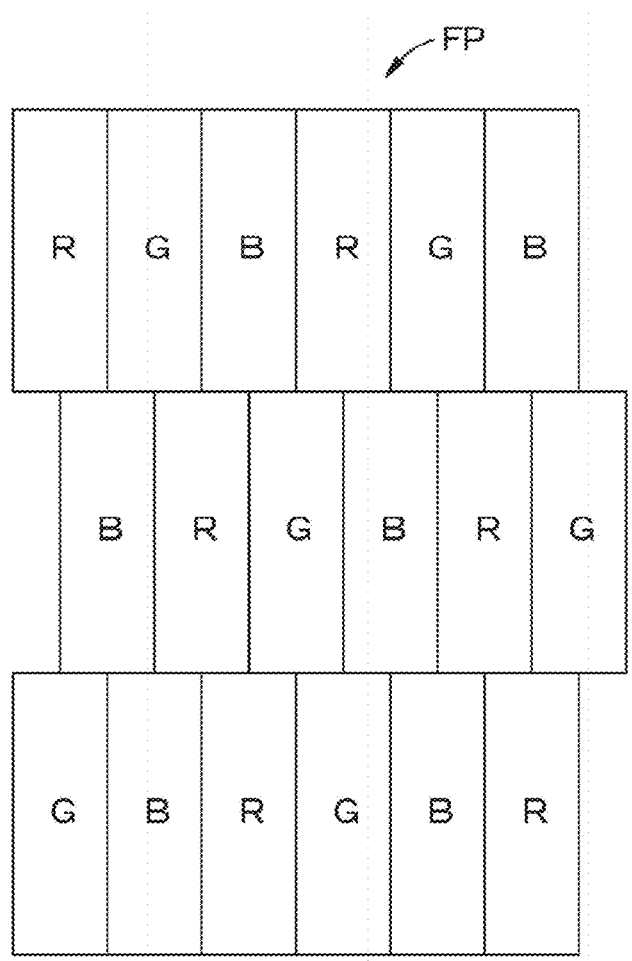
FIG. 16B is a schematic partial plan view illustrating the arrangement of the light emitting elements, following FIG. 15B.

FIGS. 15A and 15B are views for explaining an example of an arrangement relationship between the drive circuits and the light emitting elements. FIG. 15A is a schematic partial plan view illustrating a circuit arrangement of the drive circuits. FIG. 15B is a schematic partial plan view illustrating an arrangement of the light emitting elements. FIGS. 16A and 16B are schematic partial plan views illustrating the arrangement of the light emitting elements, following FIG. 15B.

In the drive circuit group, the pitches of the respective drive circuits are shifted in the column direction, as illustrated in FIG. 15A. FIG. 15B illustrates an example in which the display elements are arranged in a stripe array with no pitch shift. FIG. 16A illustrates an example in which the display elements are arranged in a mosaic array. FIG. 16B illustrates an example in which the display elements are arranged in a delta array.

The first embodiment has been described above, but the configuration of the drive circuit that controls the light emission of the light emitting element ELP is not particularly limited. Therefore, the above-described drive circuit and circuit arrangement are merely examples. The display device according to the present embodiment can take various configurations.

First Modification

In the first embodiment, various modifications can be made. Hereinafter, a first modification will be described.

Figure 17:
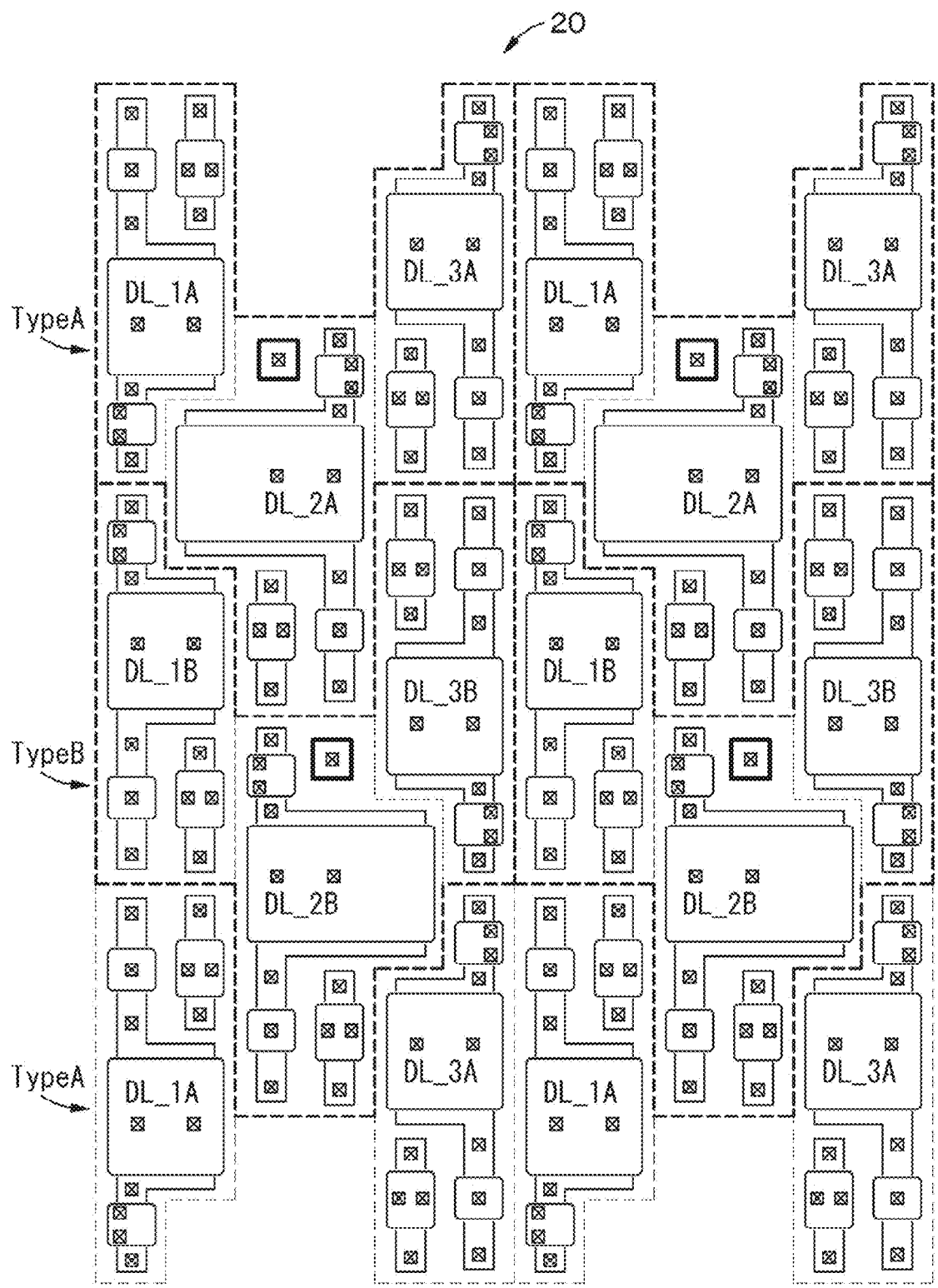
FIG. 17 is a schematic partial plan view of a substrate and the like for explaining a circuit arrangement in a drive circuit array substrate according to a first modification.

FIG. 17 is a schematic partial plan view of a substrate and the like for explaining a circuit arrangement in a drive circuit array substrate according to the first modification.

In the first embodiment, it has been described with reference to FIG. 7 that the second drive circuit belonging to one drive circuit group of the pair of the drive circuit groups has a circuit arrangement in which the second drive circuit belonging to the other drive circuit group is vertically and horizontally inverted. On the other hand, in the first modification, a second drive circuit belonging to one drive circuit group of the pair of the drive circuit groups has a circuit arrangement in which a second drive circuit belonging to the other drive circuit group is horizontally inverted.

Subsequently, a transition from the arrangement of the drive circuits of the reference example to the arrangement of the drive circuits of the first modification will be described with reference to FIGS. 18A to 19B.

Figure 18A:
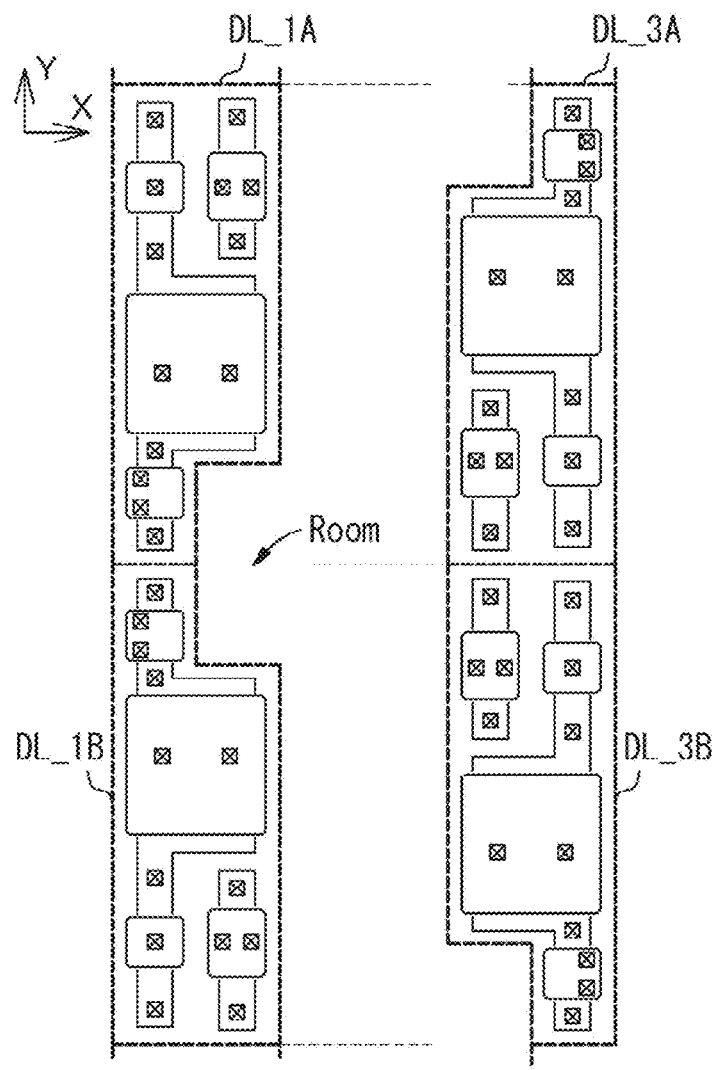
FIG. 18A is a schematic plan view for explaining an arrangement relationship of drive circuit groups in the drive circuit array substrate according to the first modification.

FIG. 18A illustrates a state after the processes illustrated in FIGS. 8A, 8B, and 9A are performed. Room generated by the omission of the well taps WTP of the respective drive circuits is denoted by a reference sign Room.

Figure 18B:
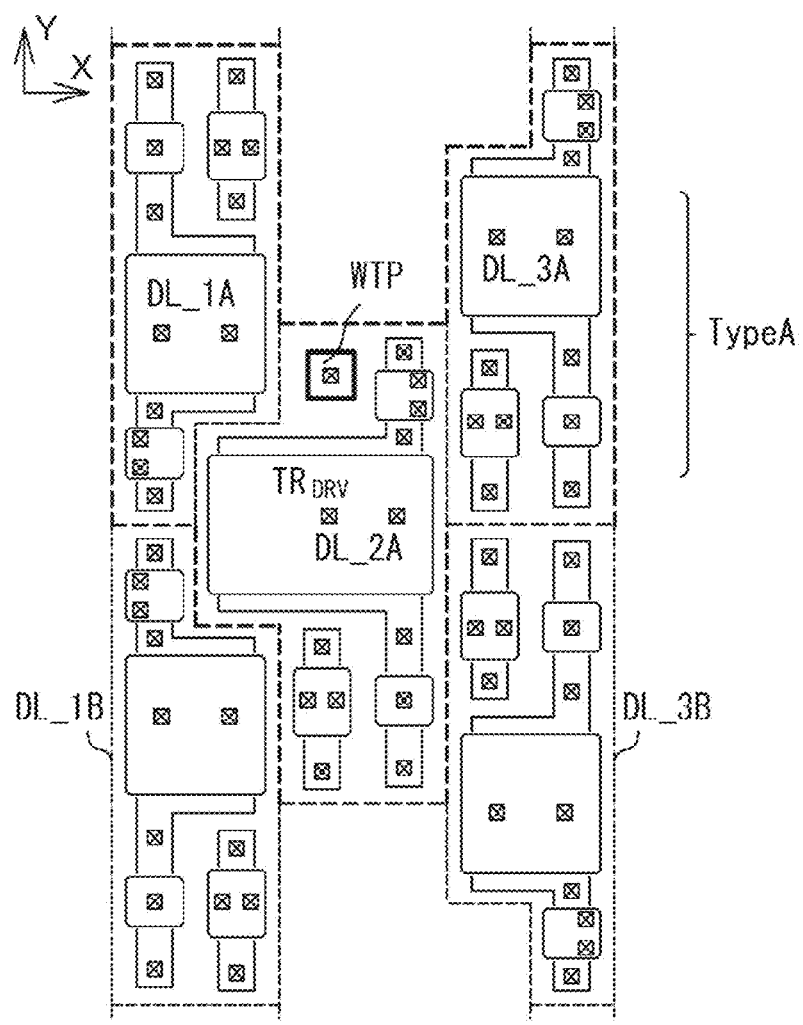
FIG. 18B is a schematic plan view for explaining the arrangement relationship of the drive circuit groups in the drive circuit array substrate according to the first modification.

Then, a second drive circuit DL_2A, having the well tap WTP and having a drive transistor configured to have a larger size, is arranged between the first drive circuits DL_1A, 1B and the third drive circuits DL_3A, 3B, as illustrated in FIG. 18B. In the example illustrated in the view, a drive circuit group denoted by a reference sign TypeA is formed.

Figure 19A:
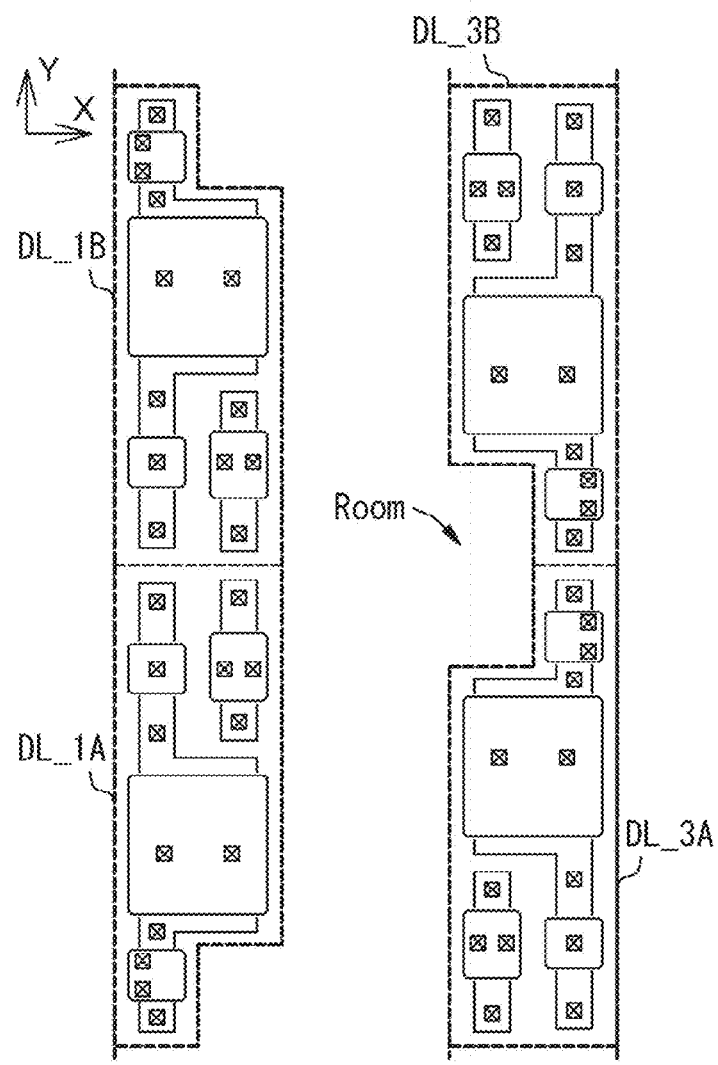
FIG. 19A is a schematic plan view for explaining the arrangement relationship of the drive circuit groups in the drive circuit array substrate according to the first modification, following FIG. 18B.
Figure 19B:
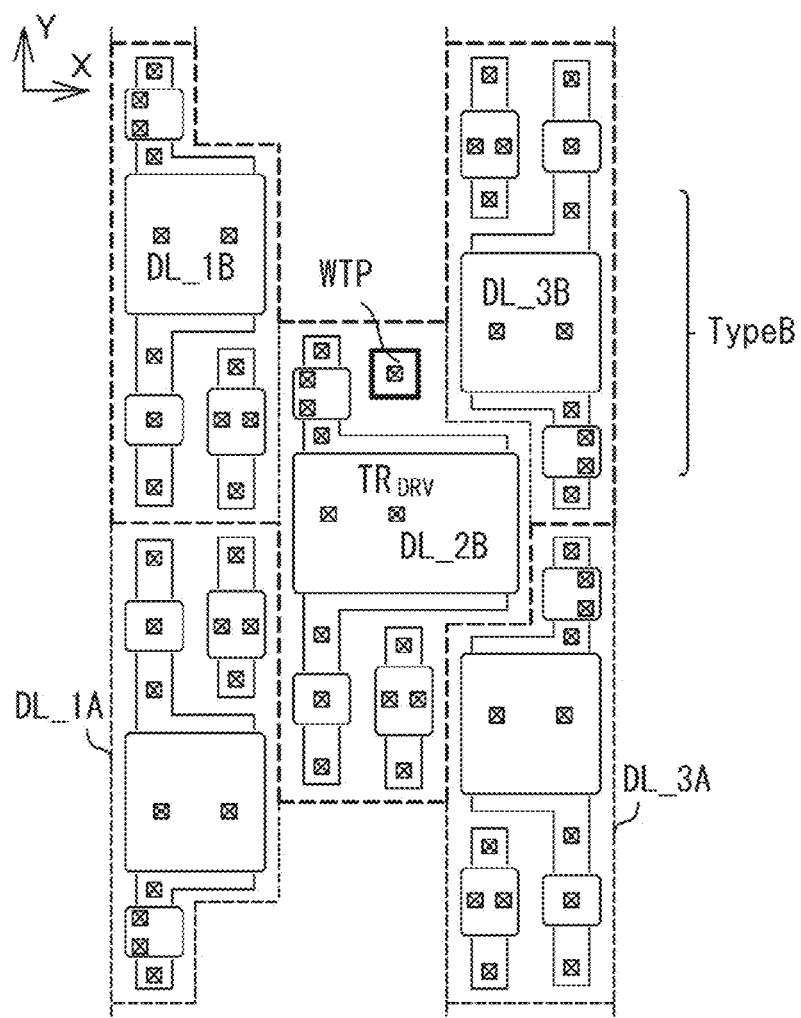
FIG. 19B is a schematic plan view for explaining the arrangement relationship of the drive circuit groups in the drive circuit array substrate according to the first modification, following FIG. 18B.

FIGS. 19A and 19B are views for explaining a drive circuit group located above or below the drive circuit group denoted by the reference sign TypeA. In the example illustrated in FIG. 19A, the well taps WTP of the third drive circuits DL_3B, 3A in the upper and lower drive pixel groups are omitted in a state of being adjacent to each other. As illustrated in FIG. 19B, a second drive circuit DL_2B, having a well tap WTP and having a drive transistor configured to have a larger size, is arranged between the first drive circuits DL_1B, 1A and the third drive circuits DL_3B, 3A. In the example illustrated in the view, a drive circuit group denoted by a reference sign TypeB is formed.

In the first modification, the third drive circuit is not required to be shifted by a predetermined amount in the column direction with respect to the first drive circuit, as described above. A configuration is formed in which only the second drive circuit is shifted by a predetermined amount in the column direction.

Second Modification

In a second modification, the display device further includes a white pixel. The drive circuit group further includes a fourth drive circuit connected to a light emitting element corresponding to the white pixel.

Figure 20:
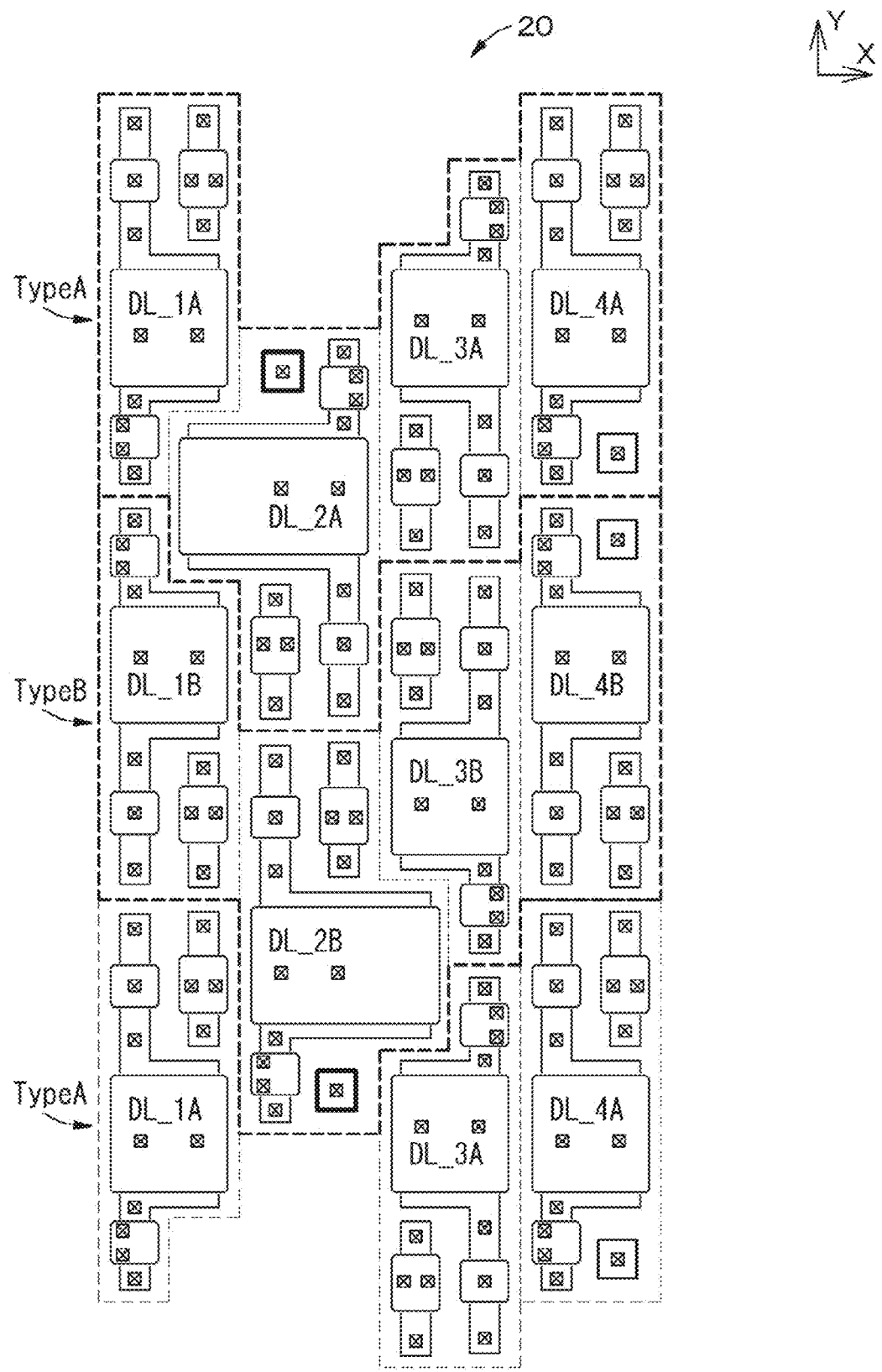
FIG. 20 is a schematic partial plan view of a substrate and the like for explaining a circuit arrangement in a drive circuit array substrate according to a second modification.

FIG. 20 is a schematic partial plan view of a substrate and the like for explaining a circuit arrangement in a drive circuit array substrate according to the second modification.

FIG. 20 illustrates an example in which the fourth drive circuit is further added based on the drive circuit group illustrated in FIG. 7. A reference sign DL_4A denotes the fourth drive circuit added to the drive circuit group TypeA, and a reference sign DL_4B denotes the fourth drive circuit added to the drive circuit group TypeB. An example is illustrated in which both the fourth drive circuits DL_4A, DL_4B have a well tap WTP and the fourth drive circuit DL_4B has a circuit arrangement in which the fourth drive circuit DL_4A is vertically inverted.

The second modification is not limited thereto. For example, a configuration can be adopted in which the fourth drive circuit is further added based on the drive circuit group illustrated in FIG. 17. In addition, a configuration can also be adopted in which the well tap is omitted even in the fourth drive circuit. Also, the transistor of the drive circuit can further be configured to have a larger size using the region where the well tap is omitted.

Also in the second modification, a planar arrangement of the light emitting element may or may not match a planar arrangement of the drive circuit. Depending on wiring between the anode electrode and the drive circuit, the light emitting element can be arranged in any plane. The respective light emitting elements can be arranged in, for example, a stripe array, a mosaic array, a square array, or a delta array.

An example of an arrangement relationship between the drive circuits and the light emitting elements will be described with reference to FIGS. 21A to 23.

Figure 21A:
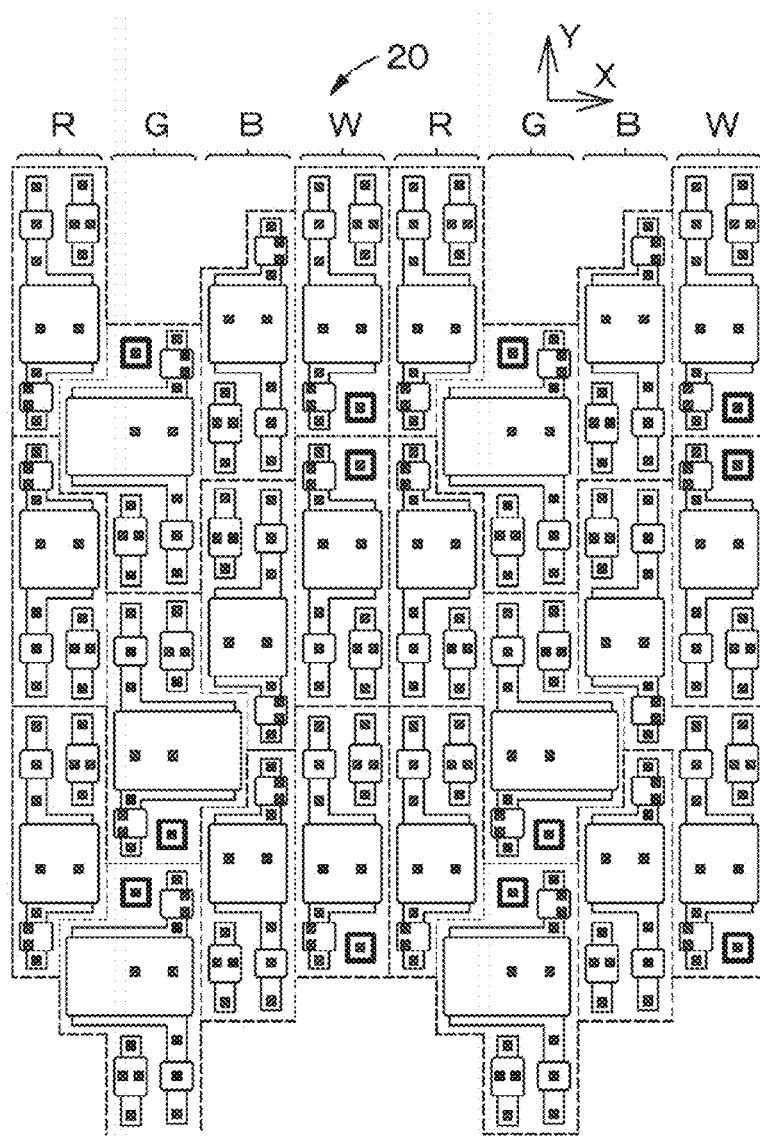
FIG. 21A is a view for explaining an example of an arrangement relationship between drive circuits and light emitting elements, and is a schematic partial plan view illustrating a circuit arrangement of the drive circuits.
Figure 21B:
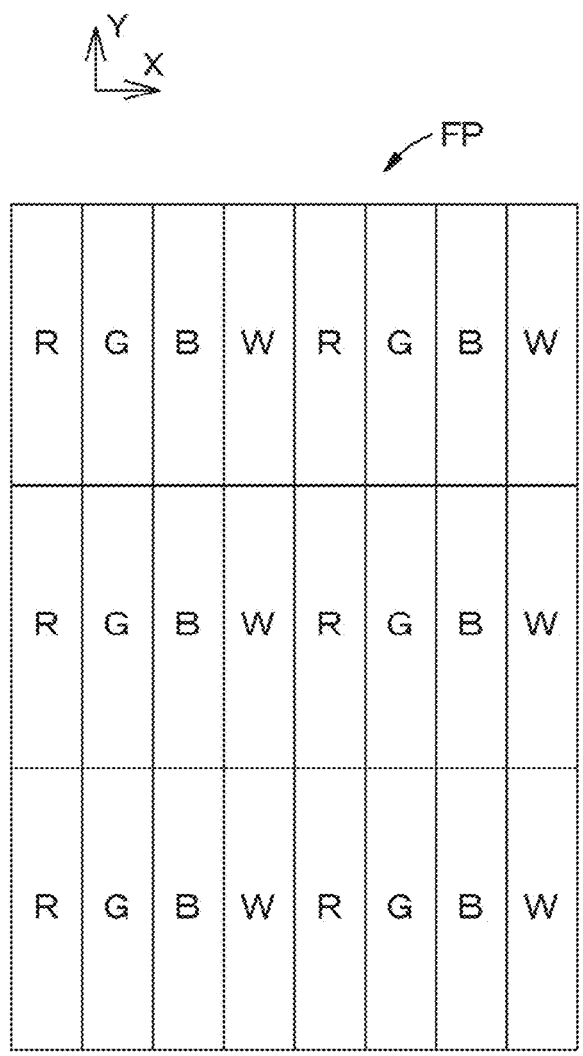
FIG. 21B is a view for explaining an example of an arrangement relationship between drive circuits and light emitting elements, and is a schematic partial plan view illustrating an arrangement of the light emitting elements.
Figure 22A:
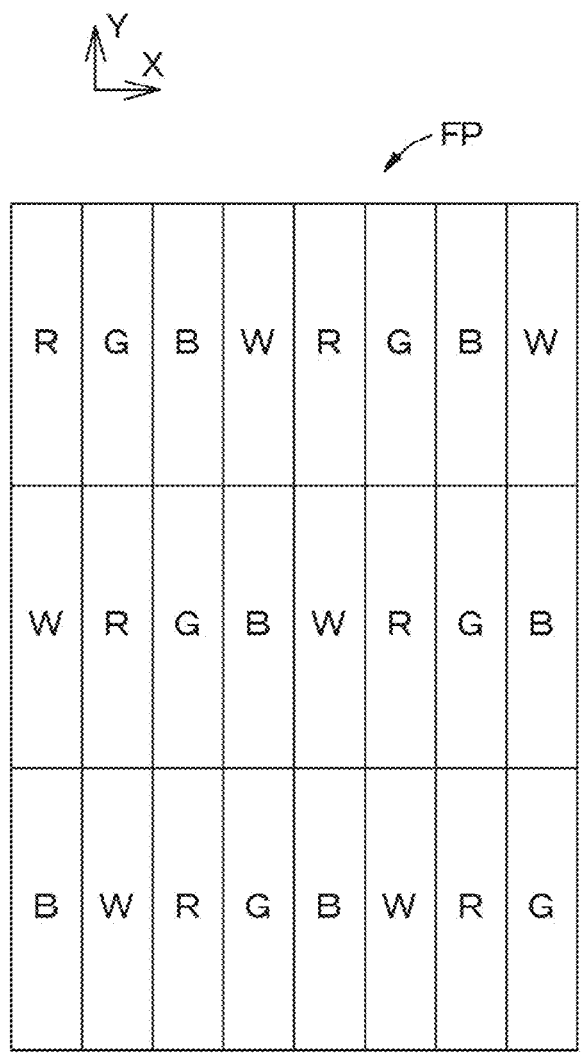
FIG. 22A is a schematic partial plan view illustrating the arrangement of the light emitting elements, following FIG. 21B.
Figure 22B:
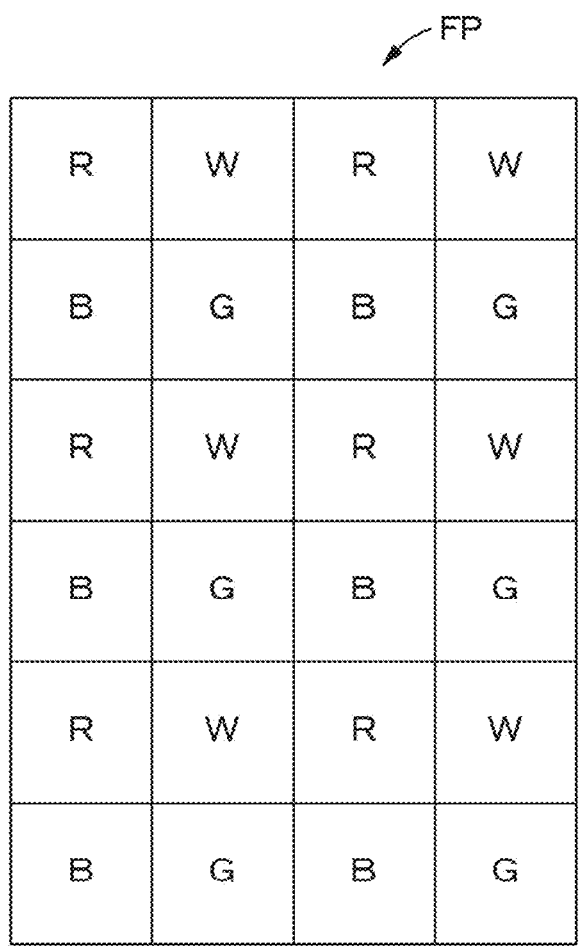
FIG. 22B is a schematic partial plan view illustrating the arrangement of the light emitting elements, following FIG. 21B.
Figure 23:
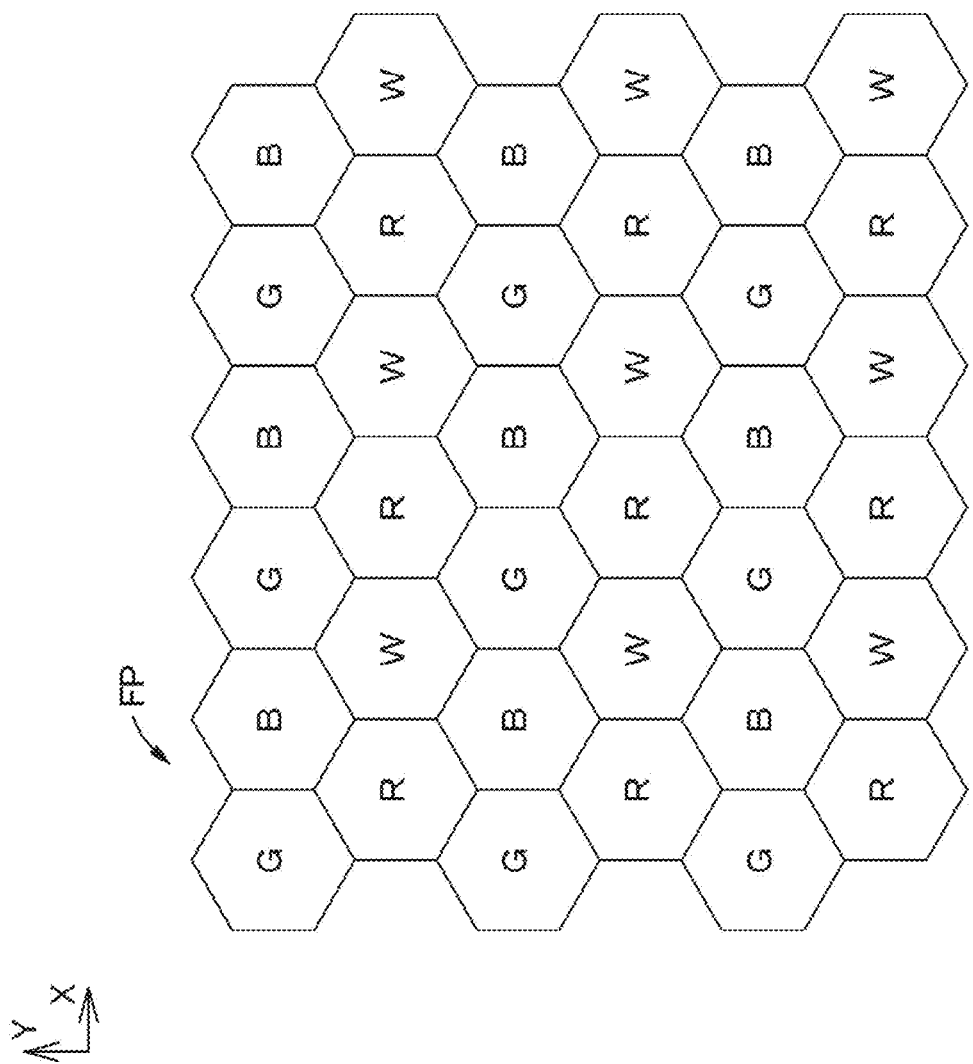
FIG. 23 is a schematic partial plan view illustrating the arrangement of the light emitting elements, following FIG. 22B.

In the drive circuit group, the second drive circuit and the third drive circuit are shifted in pitch in the column direction, as illustrated in FIG. 21A. FIG. 21B illustrates an example in which the display elements are arranged in a stripe array with no pitch shift. FIG. 22A illustrates an example in which the display elements are arranged in a mosaic array. FIG. 22B illustrates an example in which the display elements are arranged in a square array. FIG. 23 illustrates an example in which the display elements are arranged in a delta array.

Description of Electronic Apparatus

The display device according to the present disclosure described above can be used as a display unit (display device) of an electronic apparatus in any field that displays, as an image or a video, a video signal input to the electronic apparatus or a video signal generated in the electronic apparatus. As an example, it can be used as a display unit of, for example, a television set, a digital still camera, a notebook personal computer, a mobile terminal device such as a mobile phone, a video camera, a head mounted display, or the like.

The display device of the present disclosure also includes a module-shaped display device configured to be sealed. Note that the display module may be provided with a circuit unit for inputting and outputting signals and the like from the outside to a pixel array unit, a flexible printed circuit (FPC), and the like. Hereinafter, as specific examples of an electronic apparatus using the display device of the present disclosure, a digital still camera and a head mounted display will be described. However, the specific examples described here are merely examples, and the present disclosure is not limited thereto.

SPECIFIC EXAMPLE 1

Figure 24A:
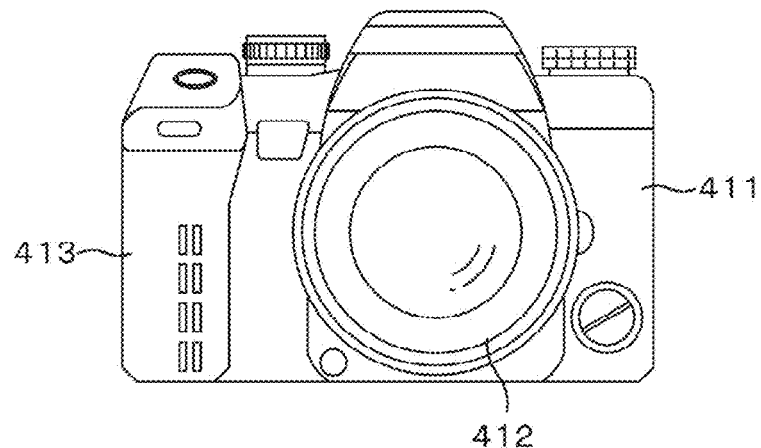
FIG. 24A is a front view of a lens interchangeable single lens reflex type digital still camera.
Figure 24B:
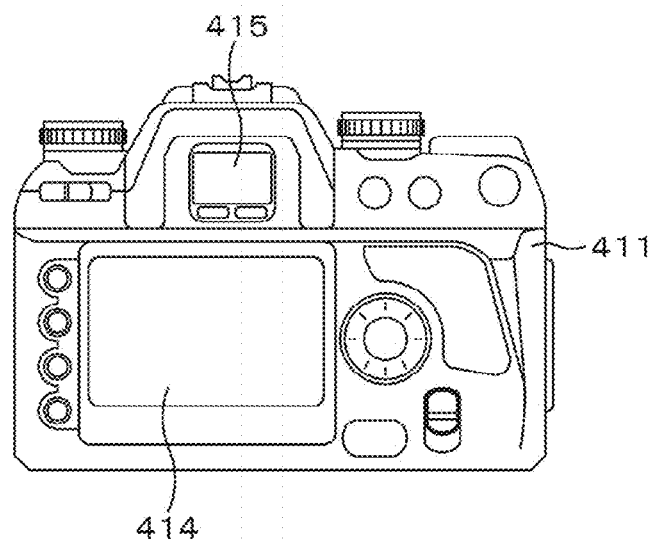
FIG. 24B is a rear view of the lens interchangeable single lens reflex type digital still camera.

FIGS. 24A and 24B are external views of a lens interchangeable single lens reflex type digital still camera, in which FIG. 24A illustrates a front view thereof, and FIG. 24B illustrates a rear view thereof. The lens interchangeable single lens reflex type digital still camera includes, for example, an interchangeable imaging lens unit (interchangeable lens) 412 on the front right side of a camera main body (camera body) 411, and a grip portion 413 to be held by a photographer on the front left side.

A monitor 414 is provided substantially at the center of the rear surface of the camera main body 411. A viewfinder (eyepiece window) 415 is provided above the monitor 414. By looking into the viewfinder 415, a photographer can visually recognize an optical image of a subject guided from the imaging lens unit 412 to decide a composition.

In the lens interchangeable single lens reflex type digital still camera having the above configuration, the display device of the present disclosure can be used as the viewfinder 415. That is, the lens interchangeable single lens reflex type digital still camera according to the present example is manufactured by using the display device of the present disclosure as the viewfinder 415.

SPECIFIC EXAMPLE 2

Figure 25:
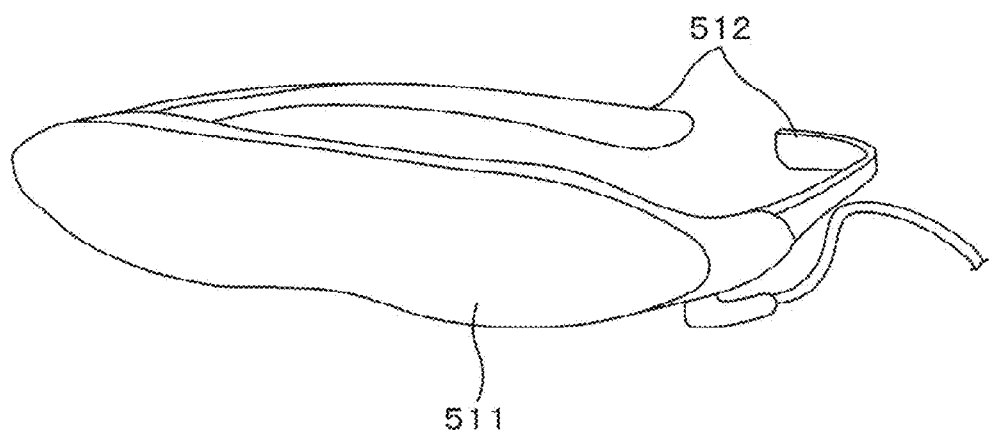
FIG. 25 is an external view of a head mounted display.

FIG. 25 is an external view of a head mounted display. The head mounted display includes, for example, ear hooks 512 for wearing on the head of a user on both sides of a glasses-shaped display unit 511. In the head mounted display, the display device of the present disclosure can be used as the display unit 511. That is, the head mounted display according to the present example is manufactured by using the display device of the present disclosure as the display unit 511.

SPECIFIC EXAMPLE 3

Figure 26:
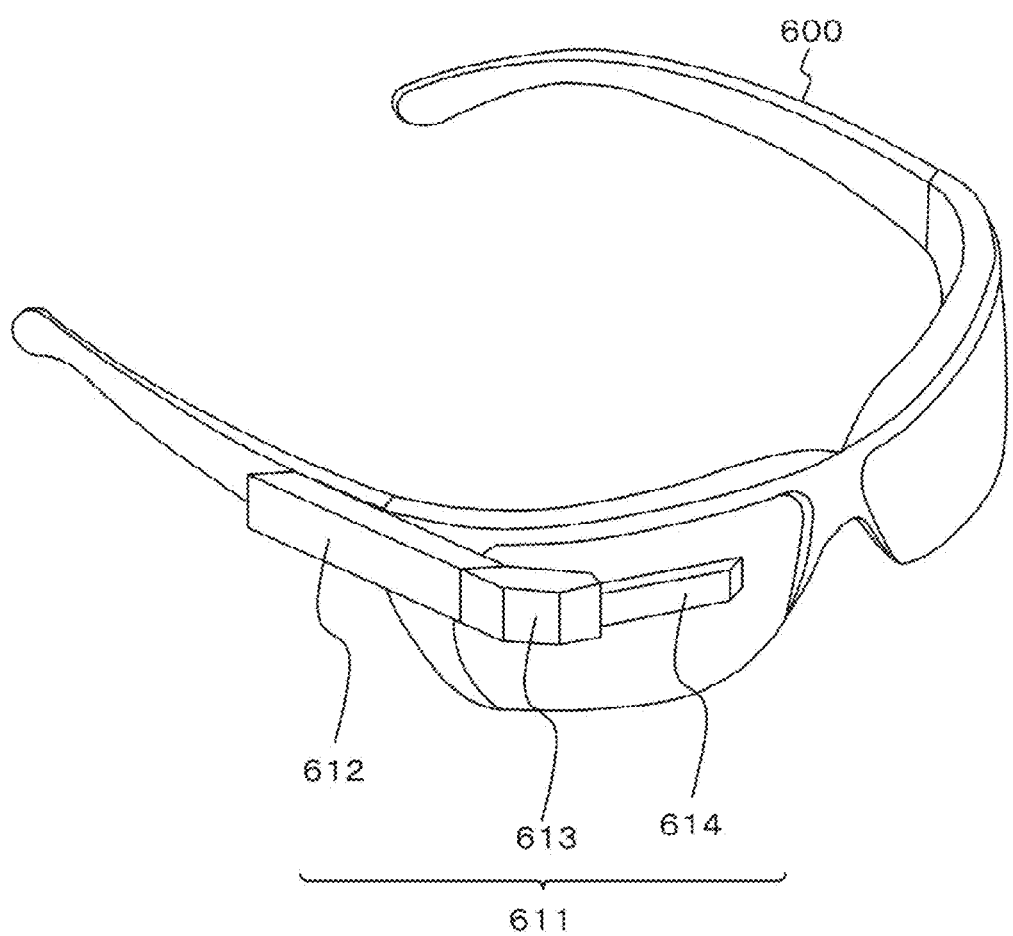
FIG. 26 is an external view of a see-through head mounted display.

FIG. 26 is an external view of a see-through head mounted display. A see-through head mounted display 611 includes a main body 612, an arm 613, and a lens barrel 614.

The main body 612 is connected to the arm 613 and a pair of glasses 600. Specifically, an end in the longitudinal direction of the main body 612 is coupled to the arm 613, and one side of the side surface of the main body 612 is connected to the pair of glasses 600 via a connecting member. Note that the main body 612 may be directly mounted on the head of a human body.

The main body 612 incorporates a control board for controlling the operation of the see-through head mounted display 611 and a display unit. The arm 613 connects the main body 612 and the lens barrel 614 and supports the lens barrel 614. Specifically, the arm 613 is coupled to each of the end of the main body 612 and the end of the lens barrel 614, and fixes the lens barrel 614. In addition, the arm 613 incorporates a signal line for communicating data relating to an image provided from the main body 612 to the lens barrel 614.

The lens barrel 614 projects image light, provided from the main body 612 via the arm 613, toward the eyes of a user wearing the see-through head mounted display 611 through an eyepiece. In the see-through head mounted display 611, the display device of the present disclosure can be used for the display unit of the main body 612.

Others

Note that the technology of the present disclosure can also have the following configurations.

A1

A drive circuit array substrate comprising drive circuits arranged in an array pattern on a semiconductor substrate, wherein
in a drive circuit group including a plurality of the drive circuits that are adjacent to each other, a well tap is provided in a part of the drive circuits of the plurality of the drive circuits included in the drive circuit group.

A2

The drive circuit array substrate according to [A1], wherein
in the plurality of the drive circuits included in the drive circuit group, a transistor constituting a predetermined drive circuit is configured to have a larger size than transistors of the other drive circuits.

A3

The drive circuit array substrate according to [A2], wherein
a transistor for supplying a current, of the transistors constituting the predetermined drive circuit, is configured to have a larger size.

A4

The drive circuit array substrate according to [A2] or [A3], wherein
in the plurality of the drive circuits included in the drive circuit group, the well tap is provided in the predetermined drive circuit.

A5

The drive circuit array substrate according to any one of [A2] to [A4], wherein
the drive circuit group includes a first drive circuit, a second drive circuit, and a third drive circuit,
the second drive circuit is arranged to be sandwiched by the first drive circuit and the third drive circuit,
the well tap is provided in the second drive circuit, and
a transistor constituting the second drive circuit is configured to have a larger size than transistors of the first drive circuit and the third drive circuit.

A6

The drive circuit array substrate according to [A5], wherein
in the drive circuit group, the third drive circuit has a circuit arrangement in which the first drive circuit is vertically and horizontally inverted.

A7

The drive circuit array substrate according to [A5] or [A6], wherein
a pair of the drive circuit groups, adjacent to each other and side by side in a longitudinal direction of the drive circuit, are arranged to form a repeating unit.

A8

The drive circuit array substrate according to [A7], wherein
the first drive circuit and the third drive circuit belonging to one drive circuit group of the pair of the drive circuit groups have circuit arrangements in which the first drive circuit and the third drive circuit belonging to an other drive circuit group are vertically inverted, respectively.

A9

The drive circuit array substrate according to [A8], wherein
the second drive circuit belonging to the one drive circuit group of the pair of the drive circuit groups has a circuit arrangement in which the second drive circuit belonging to the other drive circuit group is horizontally inverted, or a circuit arrangement in which the second drive circuit belonging to the other drive circuit group is vertically and horizontally inverted.

A10

The drive circuit array substrate according to any one of [A5] to [A9], wherein
the drive circuit group further includes a fourth drive circuit.

A11

The drive circuit array substrate according to any one of [A5] to [A10], wherein
the respective drive circuits are arranged in a stripe pattern.

B1

A display device comprising:
a drive circuit array substrate including drive circuits arranged in an array pattern on a semiconductor substrate; and
light emitting elements arranged in an array pattern over the drive circuits and driven by the drive circuits, wherein
in a drive circuit group including a plurality of the drive circuits that are adjacent to each other, a well tap is provided in a part of the drive circuits of the plurality of the drive circuits included in the drive circuit group.

B2

The display device according to [B1], in which
in a plurality of drive circuits included in a drive circuit group, a transistor for supplying a current, of transistors constituting a predetermined drive circuit, is configured to have a larger size.

B3

The display device according to [B2], in which
in a plurality of drive circuits included in a drive circuit group, a transistor for supplying a current, of transistors constituting a predetermined drive circuit, is configured to have a larger size.

B4

The display device according to [B2] or [B3], wherein
in the plurality of the drive circuits included in the drive circuit group, the well tap is provided in a predetermined drive circuit.

B5

The display device according to any one of [B2] to [B4], wherein
the drive circuit group includes a first drive circuit, a second drive circuit, and a third drive circuit,
the second drive circuit is arranged to be sandwiched by the first drive circuit and the third drive circuit,
the well tap is provided in the second drive circuit,
a transistor constituting the second drive circuit is configured to have a larger size than transistors of the first drive circuit and the third drive circuit,
the first drive circuit and the third drive circuit are connected to a light emitting element corresponding to a red pixel and a light emitting element corresponding to a blue pixel, respectively, and
the second drive circuit is connected to a light emitting element corresponding to a green pixel.

B6

The display device according to [B5], wherein
the drive circuit group further includes a fourth drive circuit connected to a light emitting element corresponding to a white pixel.

B7

The display device according to any one of [B1] to [B6], wherein
the respective light emitting elements are arranged in a stripe array, a mosaic array, a square array, or a delta array.

B8

The display device according to any one of [B1] to [B7], wherein
the light emitting element includes an organic electroluminescence element.

C1

An electronic apparatus comprising a display device including:
a drive circuit array substrate including drive circuits arranged in an array pattern on a semiconductor substrate; and
light emitting elements arranged in an array pattern over the drive circuits and driven by the drive circuits, wherein
in a drive circuit group including a plurality of the drive circuits that are adjacent to each other, a well tap is provided in a part of the drive circuits of the plurality of the drive circuits included in the drive circuit group.

C2

The electronic apparatus according to [C1], in which
in a plurality of drive circuits included in a drive circuit group, a transistor for supplying a current, of transistors constituting a predetermined drive circuit, is configured to have a larger size.

C3

The electronic apparatus according to [C2], in which
in the plurality of drive circuits included in the drive circuit group, a transistor for supplying a current, of transistors constituting a predetermined drive circuit, is configured to have a larger size.

C4

The electronic apparatus according to [C2] or [C3], in which
in the plurality of drive circuits included in the drive circuit group, a well tap is provided in a predetermined drive circuit.

C5

The electronic apparatus according to any one of [C2] to [C4], in which
the drive circuit group includes a first drive circuit, a second drive circuit, and a third drive circuit,
the second drive circuit is arranged to be sandwiched by the first drive circuit and the third drive circuit,
the well tap is provided in the second drive circuit,
a transistor constituting the second drive circuit is configured to have a larger size than transistors of the first drive circuit and the third drive circuit,
the first drive circuit and the third drive circuit are connected to a light emitting element corresponding to a red pixel and a light emitting element corresponding to a blue pixel, respectively, and
the second drive circuit is connected to a light emitting element corresponding to a green pixel.

C6

The electronic apparatus according to [C5], in which
the drive circuit group further includes a fourth drive circuit connected to a light emitting element corresponding to a white pixel.

C7

The electronic apparatus according to any one of [C1] to [C6], in which
the respective light emitting elements are arranged in a stripe array, a mosaic array, a square array, or a delta array.

C8

The electronic apparatus according to any one of [C1] to [C7], in which
the light emitting element includes an organic electroluminescence element.

REFERENCE SIGNS LIST

1 DISPLAY DEVICE
11 HORIZONTAL DRIVE CIRCUIT
12 VERTICAL DRIVE CIRCUIT
13 INITIALIZATION CIRCUIT
14 LIGHT EMISSION CONTROL CIRCUIT
20, 920 DRIVE CIRCUIT ARRAY SUBSTRATE
21 SUBSTRATE
22 COMMON WELL REGION
23 ELEMENT ISOLATION REGION
24A, 24B SOURCE/DRAIN REGION
25 GATE INSULATING FILM
26 GATE ELECTRODE
27 INTERLAYER INSULATING FILM
28A, 28B SOURCE/DRAIN ELECTRODE
31 FLATTENING FILM
32 ANODE ELECTRODE
33 PARTITION
40 ORGANIC LAYER
51 CATHODE ELECTRODE
52 PROTECTIVE FILM
61 COLOR FILTER
62 TRANSPARENT SUBSTRATE
411 CAMERA MAIN BODY
412 IMAGING LENS UNIT
413 GRIP PORTION
414 MONITOR
415 VIEWFINDER
511 GLASSES-SHAPED DISPLAY UNIT
512 EAR HOOK
600 PAIR OF GLASSES
611 SEE-THROUGH HEAD MOUNTED DISPLAY
612 MAIN BODY
613 ARM
614 LENS BARREL

The invention claimed is:

1. A display device, comprising:
    a semiconductor substrate;
    a first drive circuit located on the semiconductor substrate;
    a second drive circuit located on the semiconductor substrate;
    a third drive circuit located on the semiconductor substrate;
    a first light emitting element configured to be controlled by the first drive circuit;
    a second light emitting element configured to be controlled by the second drive circuit; and
    a third light emitting element configured to be controlled by the third drive circuit, wherein
    each of the first drive circuit, the second drive circuit, and the third drive circuit respectively include a write transistor, a drive transistor, a first transistor, and a second transistor,
    a source region or a drain region of the first transistor of one of the first drive circuit, the second drive circuit or the third drive circuit is electrically connected to an anode electrode of a corresponding one of the first light emitting element, the second light emitting element, or the third light emitting element,
    the second transistor of said one of the first drive circuit, the second drive circuit or the third drive circuit is electrically connected between a power supply line and the anode electrode,
    the second drive circuit is arranged between the first drive circuit and the third drive circuit,
    the second drive circuit is adjacent to the first drive circuit and the third drive circuit,
    a first well tap is provided to supply a voltage to a well region of the semiconductor substrate for the first drive circuit, the second drive circuit, and the third drive circuit, and
    the first well tap is arranged between a gate electrode of a drive transistor of the first drive circuit and a gate electrode of a drive transistor of the third drive circuit.

2. The display device according to claim 1, wherein the gate electrode of the drive transistor of the second drive circuit is arranged in an alignment direction of the gate electrode of the drive transistor of the first drive circuit and the gate electrode of the drive transistor of the third drive circuit.

3. The display device according to claim 1, wherein a control line is connected to the gate electrode of the second transistor of said one of the first drive circuit, the second drive circuit or the third drive circuit via a first contact portion, and the first contact portion is arranged to be offset from a center line extending along a channel length direction of the second transistor of said one of the first drive circuit, the second drive circuit or the third drive circuit.

4. The display device according to claim 3, wherein the control line overlaps the gate electrode of the second transistor of said one of the first drive circuit, the second drive circuit or the third drive circuit in a vertical direction of the semiconductor substrate in a cross sectional view.

5. The display device according to claim 1, wherein the write transistor, the drive transistor, the first transistor and the second transistor of said one of the first drive circuit, the second drive circuit or the third drive circuit are transistors of a same conductivity type.

6. The display device according to claim 1, wherein a scanning line is connected to the gate electrode of the write transistor of said one of the first drive circuit, the second drive circuit or the third drive circuit via a second contact part, and the second contact part is arranged offset from a center line extending along a channel length direction of the write transistor of said one of the first drive circuit, the second drive circuit or the third drive circuit.

7. The display device according to claim 6, wherein the scanning line overlaps the gate electrode of the write transistor of said one of the first drive circuit, the second drive circuit or the third drive circuit in a vertical direction of the semiconductor substrate in a cross sectional view.

8. The display device according to claim 1, wherein the first transistor of said one of the first drive circuit, the second drive circuit or the third drive circuit is an initialization transistor.

9. The display device according to claim 1, wherein the second transistor of said one of the first drive circuit, the second drive circuit or the third drive circuit is a light emission control transistor.

10. A display device comprising:
    a semiconductor substrate;
    a first drive circuit located on the semiconductor substrate;
    a second drive circuit located on the semiconductor substrate;
    a third drive circuit located on the semiconductor substrate;
    a first light emitting element configured to be driven by the first drive circuit;
    a second light emitting element configure to be driven by the second drive circuit; and
    a third light emitting element configured to be driven by the third drive circuit, wherein
    each of the first drive circuit, the second drive circuit, and the third drive circuit respectively include a first transistor, a second transistor, a third transistor, and a fourth transistor,
    the first transistor of one of the first drive circuit, the second drive circuit or the third drive circuit is connected between a signal line and a gate electrode of the second transistor,
    a source region or a drain region of the third transistor of said one of the first drive circuit, the second drive circuit or the third drive circuit is connected to an anode electrode of a corresponding one of the first light emitting element, the second light emitting element, and the third light emitting element,
    the second transistor and the fourth transistor of said one of the first drive circuit, the second drive circuit or the third drive circuit are connected between a power supply line and the anode electrode,
    the second drive circuit is arranged between the first drive circuit and the third drive circuit,
    the second drive circuit is adjacent to the first drive circuit and the third drive circuit,
    only a single well tap is provided for supplying voltage to a well region of the semiconductor substrate for the first drive circuit, the second drive circuit, and the third drive circuit, and
    the single well tap is disposed between the gate electrode of the second transistor of the first drive circuit and the gate electrode of the second transistor of the third drive circuit.

11. The display device according to claim 10, wherein the gate electrode of the second transistor of the second drive circuit is connected to the gate electrode of the second transistor of the first drive circuit, the gate electrode of the second transistor of the third drive circuit, and the single well tap.

12. The display device according to claim 10, wherein a control line is connected to the gate electrode of the fourth transistor of said one of the first drive circuit, the second drive circuit or the third drive circuit via a first contact part, and the first contact part is arranged offset from a center line extending along a channel length direction of the fourth transistor of said one of the first drive circuit, the second drive circuit or the third drive circuit.

13. The display device according to claim 12, wherein the control line overlaps the gate electrode of the fourth transistor of said one of the first drive circuit, the second drive circuit or the third drive circuit in a vertical direction of the semiconductor sub strate in a cross sectional view.

14. The display device according to claim 10, wherein the first transistor, the second transistor, the third transistor, and the fourth transistor of said one of the first drive circuit, the second drive circuit or the third drive circuit are transistors of a same conductivity type.

15. The display device according to claim 10, wherein a scanning line is connected to the gate electrode of the first transistor of said one of the first drive circuit, the second drive circuit or the third drive circuit via a second contact part, and the second contact part is arranged offset from a center line extending along a channel length direction of the first transistor of said one of the first drive circuit, the second drive circuit or the third drive circuit.

16. The display device according to claim 15, wherein the scanning line overlaps the gate electrode of the first transistor of said one of the first drive circuit, the second drive circuit or the third drive circuit in a vertical direction of the semiconductor substrate in a cross sectional view.

17. The display device according to claim 10, wherein the first transistor of said one of the first drive circuit, the second drive circuit or the third drive circuit is a write transistor.

18. The display device according to claim 10, wherein the second transistor of said one of the first drive circuit, the second drive circuit or the third drive circuit is a drive transistor.

19. The display device according to claim 10, wherein the third transistor of said one of the first drive circuit, the second drive circuit or the third drive circuit is an initialization transistor.

20. The display device according to claim 10, wherein the fourth transistor of said one of the first drive circuit, the second drive circuit or the third drive circuit is a light emission control transistor.

\* \* \* \* \*